US012713727B2

(12) United States Patent
Noh et al.

(10) Patent No.: US 12,713,727 B2
(45) Date of Patent: Aug. 18, 2026

(54) IMAGE SENSOR

(71) Applicant: Samsung Electronics Co., Ltd., Suwon-si (KR)

(72) Inventors: Jonghyeon Noh, Suwon-si (KR); Seunghwi Yoo, Suwon-si (KR); Kooktae Kim, Suwon-si (KR); Jingyun Kim, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 356 days.

(21) Appl. No.: 18/512,600

(22) Filed: Nov. 17, 2023

(65) Prior Publication Data

US 2024/0222408 A1 Jul. 4, 2024

(30) Foreign Application Priority Data

Dec. 28, 2022 (KR) ........................ 10-2022-0187970

(51) Int. Cl.
*H01L 27/146* (2006.01)
*H10F 39/00* (2025.01)

(52) U.S. Cl.
CPC ......... *H10F 39/807* (2025.01); *H10F 39/802* (2025.01)

(58) Field of Classification Search
CPC ............................ H10F 39/807; H10F 39/802
See application file for complete search history.

(56) References Cited

U.S. PATENT DOCUMENTS

| | | | |
|---|---|---|---|
| 8,975,155 | B2 | 3/2015 | Chuang et al. |
| 9,508,771 | B2 | 11/2016 | Lee et al. |
| 10,658,410 | B2 | 5/2020 | Cheng et al. |
| 10,741,603 | B2 | 8/2020 | Huang et al. |
| 10,825,853 | B2 | 11/2020 | Chiang et al. |

(Continued)

FOREIGN PATENT DOCUMENTS

| | | | |
|---|---|---|---|
| KR | 10-2007-0066473 | A | 6/2007 |
| KR | 20190139035 | A | 12/2019 |

(Continued)

OTHER PUBLICATIONS

Korean Office Action for corresponding Korean Application No. 10-2022-0187970 dated Apr. 17, 2026.

*Primary Examiner* — Peniel M Gumedzoe
(74) *Attorney, Agent, or Firm* — Harness, Dickey & Pierce, P.L.C.

(57) ABSTRACT

An image sensor may include a substrate; a unit pixel region including a photoelectric conversion region; a pixel isolation trench defining the unit pixel region, and extending in a first and a second horizontal direction; and a pixel isolation structure in the pixel isolation trench, wherein the pixel isolation structure includes a dielectric layer on an inner wall of the pixel isolation trench; a first semiconductor pattern on the dielectric layer and including a first dopant; a first insulating layer on a first portion of the first semiconductor pattern overlapping the photoelectric conversion region; a second semiconductor pattern on a second portion of the first semiconductor pattern not overlapping with the photoelectric conversion region, wherein the photoelectric conversion region includes a doped region on an outer wall of the pixel isolation structure, and the doped region includes the first dopant.

20 Claims, 28 Drawing Sheets

(56) References Cited

U.S. PATENT DOCUMENTS

| | | | | |
|---|---|---|---|---|
| 2008/0102557 | A1 | 5/2008 | Kim et al. | |
| 2019/0378865 | A1* | 12/2019 | Zhang | H10F 39/18 |
| 2022/0077204 | A1 | 3/2022 | Lee et al. | |
| 2022/0310676 | A1* | 9/2022 | Kim | H10F 39/8053 |
| 2022/0415936 | A1* | 12/2022 | Jeon | H10F 39/182 |

FOREIGN PATENT DOCUMENTS

| | | | |
|---|---|---|---|
| KR | 20220106901 | A | 8/2022 |
| KR | 20220134158 | A | 10/2022 |

* cited by examiner

FIG. 3

307 303 90 81 TR3 TR4 71 TR5 83 TR6 73 30 100b 100 103 101 100a I' 110 110 110 110 110' 111 AR OB PAD I 10 20 45 40 1000 2000 x z y 1A
480A
440_2
460A
440
420
410C
410A
TR2
101C
101A
103
110C
110A
B-B'
110B
A-A'
470A
450A
440_1
410B
TR1
101B
Z
D
y
x 1C
103
110A
110B
110C
470C
450C
440
440_1
420
410B
410A
TR1
101B
101A
A-A'
480C
440_2
460C
410C
TR2
101C
B-B'
Z
y
x
D

IMAGE SENSOR

CROSS-REFERENCE TO RELATED APPLICATION

This application is based on and claims priority under 35 U.S.C. § 119 to Korean Patent Application No. 10-2022-0187970, filed on Dec. 28, 2022, in the Korean Intellectual Property Office, the disclosure of which is incorporated by reference herein in its entirety.

BACKGROUND

The inventive concepts relate to image sensors, and more particularly, to image sensors capable of providing a clear image signal.

An image sensor converts an optical image into an electrical signal. Commonly used image sensors include a charge coupled device (CCD) type image sensor and a CMOS type image sensor (CIS). Such an image sensor includes a plurality of pixels arranged in a two-dimensional matrix, and each pixel outputs an image signal from light energy. Each of the plurality of pixels accumulates photocharges corresponding to the amount of light incident through a photoelectric conversion element, and outputs a pixel signal based on the accumulated photocharges. Recently, as the degree of integration of image sensors increases, the size of pixels and components of pixel circuits tends to decrease.

SUMMARY

The inventive concepts provide image sensors with improved reliability and performance.

The problems to be solved by the technical spirit of the inventive concepts are not limited to the problems mentioned above, and other problems not mentioned will be clearly understood by those skilled in the art from the following description.

An image sensor according to some aspects of the inventive concepts are provided. The image sensor may include a substrate, a unit pixel region in the substrate and including a photoelectric conversion region, a pixel isolation trench defining the unit pixel region, penetrating the substrate in a vertical direction, and extending in a first horizontal direction and a second horizontal direction crossing each other, and a pixel isolation structure in the pixel isolation trench, wherein the pixel isolation structure includes a dielectric layer on an inner wall of the pixel isolation trench; a first semiconductor pattern conformally on the dielectric layer and including a first dopant, a first insulating layer on a first portion of the first semiconductor pattern overlapping the photoelectric conversion region in one of the first horizontal direction and the second horizontal direction, a second semiconductor pattern on a second portion of the first semiconductor pattern that does not overlap with the photoelectric conversion region in the first horizontal direction and the second horizontal direction, wherein the photoelectric conversion region includes a doped region on an outer wall of the pixel isolation structure, and the doped region includes the first dopant.

An image sensor according to some aspects of the inventive concepts are provided. The image sensor includes a substrate; a plurality of unit pixel regions in the substrate and spaced apart from each other in a first horizontal direction and a second horizontal direction; a plurality of photoelectric conversion regions within the plurality of unit pixel regions and including a doped region, respectively; a lattice-shaped pixel isolation trench defining the plurality of unit pixel regions and penetrating the substrate in a vertical direction; and a pixel isolation structure within the pixel isolation trench, wherein the pixel isolation trench includes a first region and a second region in the first horizontal direction and the second horizontal direction, and the first region is a region excluding the second region, and the second region includes a central region that does not overlap with the photoelectric conversion region in the first horizontal direction and the second horizontal direction, wherein the pixel isolation structure includes a dielectric layer on an inner wall of the pixel isolation trench, a first semiconductor pattern conformally on the dielectric layer and including a first dopant, a first buried insulating layer in the first region on the first semiconductor pattern, and a second semiconductor pattern in the second region on the first semiconductor pattern, and wherein the doped region includes the first dopant.

An image sensor according to some aspects of the inventive concepts are provided. The image sensor includes a substrate having a first surface and a second surface facing each other; a plurality of photoelectric conversion regions spaced apart from each other in a first horizontal direction and a second horizontal direction, including a first photoelectric conversion region in the substrate in a direction perpendicular to a first surface; a second photoelectric conversion region overlapping with the first photoelectric conversion region in one of the first horizontal direction and the second horizontal direction; and a third photoelectric conversion region not overlapping with the first photoelectric conversion region in the first horizontal direction and the second horizontal direction; a pixel isolation structure between each of the plurality of photoelectric conversion regions and in a pixel isolation trench penetrating through the substrate from the first surface; and a color filter and a micro lens on the second surface, wherein the pixel isolation trench includes: a straight-line shaped first trench region between the first photoelectric conversion region and the second photoelectric conversion region; and a cross-shaped second trench region between the first photoelectric conversion region and the third photoelectric conversion region, wherein the pixel isolation structure includes a dielectric layer on inner walls of the first trench region and the second trench region of the pixel isolation trench, a first semiconductor pattern that conformally covers the dielectric layer and includes polysilicon doped with boron (B), a first insulating layer on the first semiconductor in the first trench region and including silicon nitride, and a second semiconductor pattern on the first semiconductor pattern in the second trench region and including undoped polysilicon, and wherein the plurality of photoelectric conversion regions each include a doped region on an outer wall of each of the first trench region and the second trench region, and the doped region is doped with boron (B).

BRIEF DESCRIPTION OF THE DRAWINGS

Example embodiments will be more clearly understood from the following detailed description taken in conjunction with the accompanying drawings in which:

FIG. 3 is a cross-sectional view taken along line I-I' of FIG. 2;

FIGS. 6A, 7A, and 8A are plan views of a pixel array region of an image sensor according to some example embodiments, and FIGS. 6B, 7B, and 8B are enlarged cross-sectional views of a pixel array region of the image sensor shown in FIGS. 6A, 7A, and 8A, respectively;

FIGS. 13A to 13L are cross-sectional views illustrating a manufacturing process of an image sensor according to some example embodiments.

DETAILED DESCRIPTION

Hereinafter, example embodiments according to the inventive concepts will be described in detail with reference to the accompanying drawings.

Figure 1:
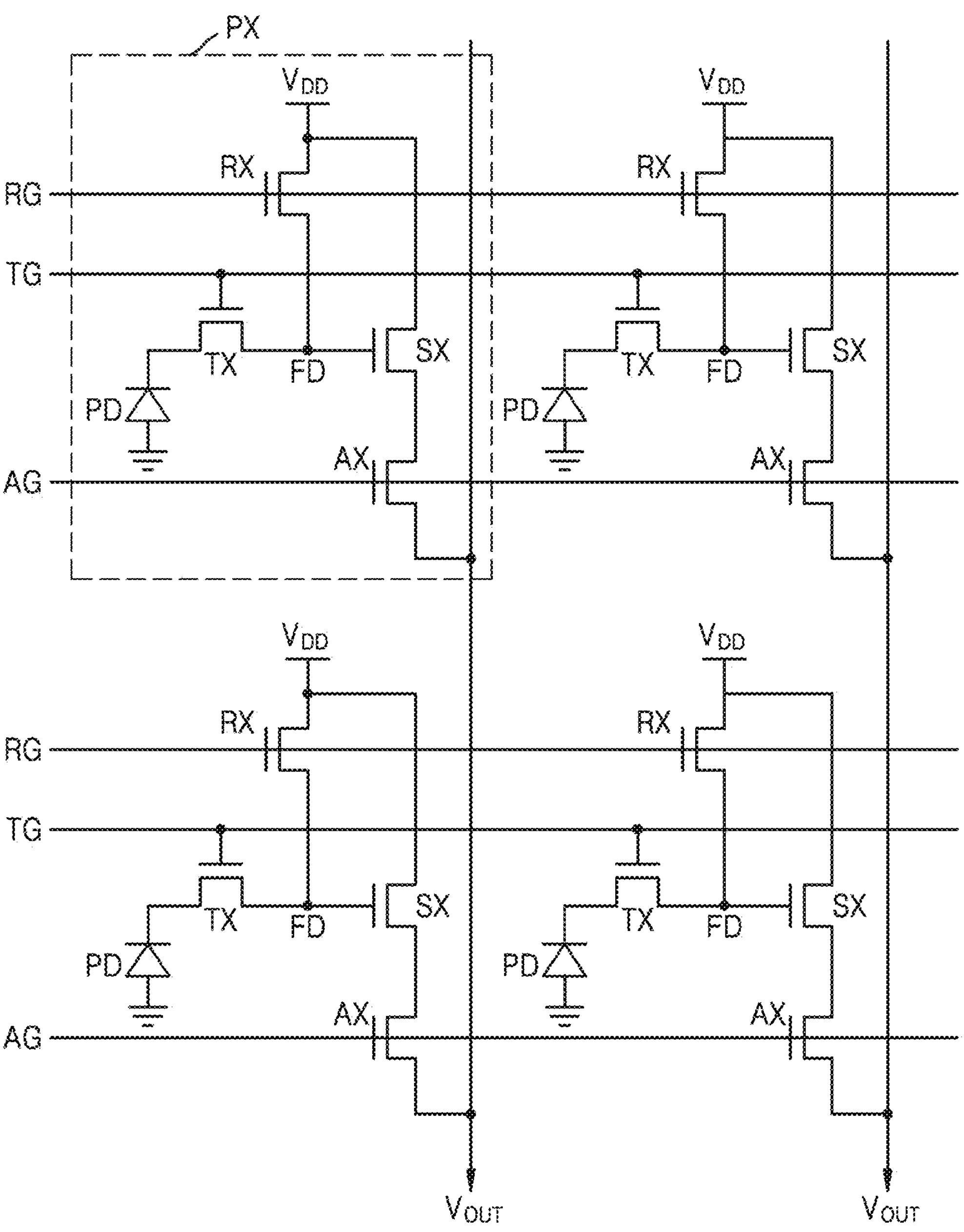
FIG. 1 is a circuit diagram of an image sensor according to some example embodiments.

FIG. 1 is a circuit diagram of an image sensor according to some example embodiments.

Referring to FIG. 1, each of unit pixel regions PX of the image sensor may include a photoelectric conversion region PD, a transfer transistor TX, a source follower transistor SX, a reset transistor RX, and a selection transistor AX. The transfer transistor TX, the source follower transistor SX, the reset transistor RX, and the selection transistor AX may each include a transfer gate TG, a reset gate RG, and a select gate AG.

The photoelectric conversion region PD may be a photodiode including an n-type impurity region and a p-type impurity region. A floating diffusion region FD may function as a drain of the transfer transistor TX. The floating diffusion region FD may function as a source of the reset transistor RX. The source follower transistor SX is connected to the selection transistor AX.

An operation of the image sensor is described with reference to FIG. 1 as follows. First, in a state in which light is blocked, a power supply voltage $V_{DD}$ is applied to the drain of the reset transistor RX and the drain of the source follower transistor SX, and the reset transistor RX is turned on to discharge charges remaining in the floating diffusion region FD. Afterwards, when the reset transistor RX is turned off and light from the outside is incident on the photoelectric conversion region PD, electron-hole pairs are generated in the photoelectric conversion region PD. Holes move to a P-type impurity region and electrons move to the n-type impurity region of the photoelectric conversion region PD and accumulate. When the transfer transistor TX is turned on, charges such as electrons and holes are transferred to the floating diffusion region FD and accumulate. A gate bias of the source follower transistor SX changes in proportion to the accumulated charge, resulting in a change in a source potential of the source follower transistor SX. At this time, when the selection transistor AX is turned on, a signal by a charge is read through a column line.

A wiring line may be electrically connected to at least one of the transfer gate TG, the reset gate RG, and the selection gate AG. The wiring line may be configured to apply the power voltage VDD to the drain of the reset transistor RX or the drain of the source follower transistor SX. The wiring line may include a column line connected to the selection transistor AX. The wiring line may be wirings to be described later.

Although in FIG. 1 a pixel including one photoelectric conversion region PD and four transistors TX, RX, AX, and SX is illustrated, some example embodiments according to the inventive concepts are not limited thereto. For example, a plurality of pixels may be provided, and the reset transistor RX, the source follower transistor SX, or the selection transistor AX may be shared with neighboring pixels. Accordingly, the degree of integration of the image sensor may be improved.

Figure 2:
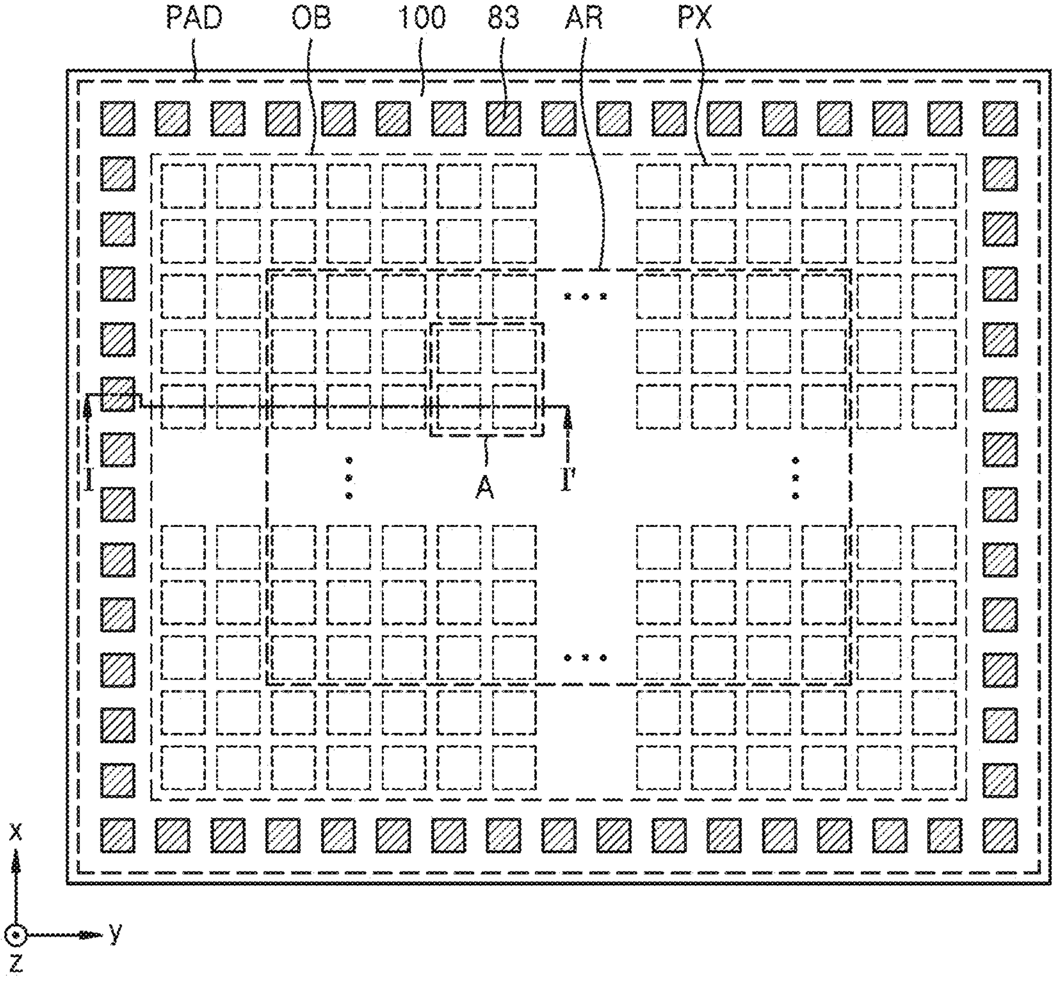
FIG. 2 is a plan view illustrating an image sensor according to some example embodiments.
Figure 3:
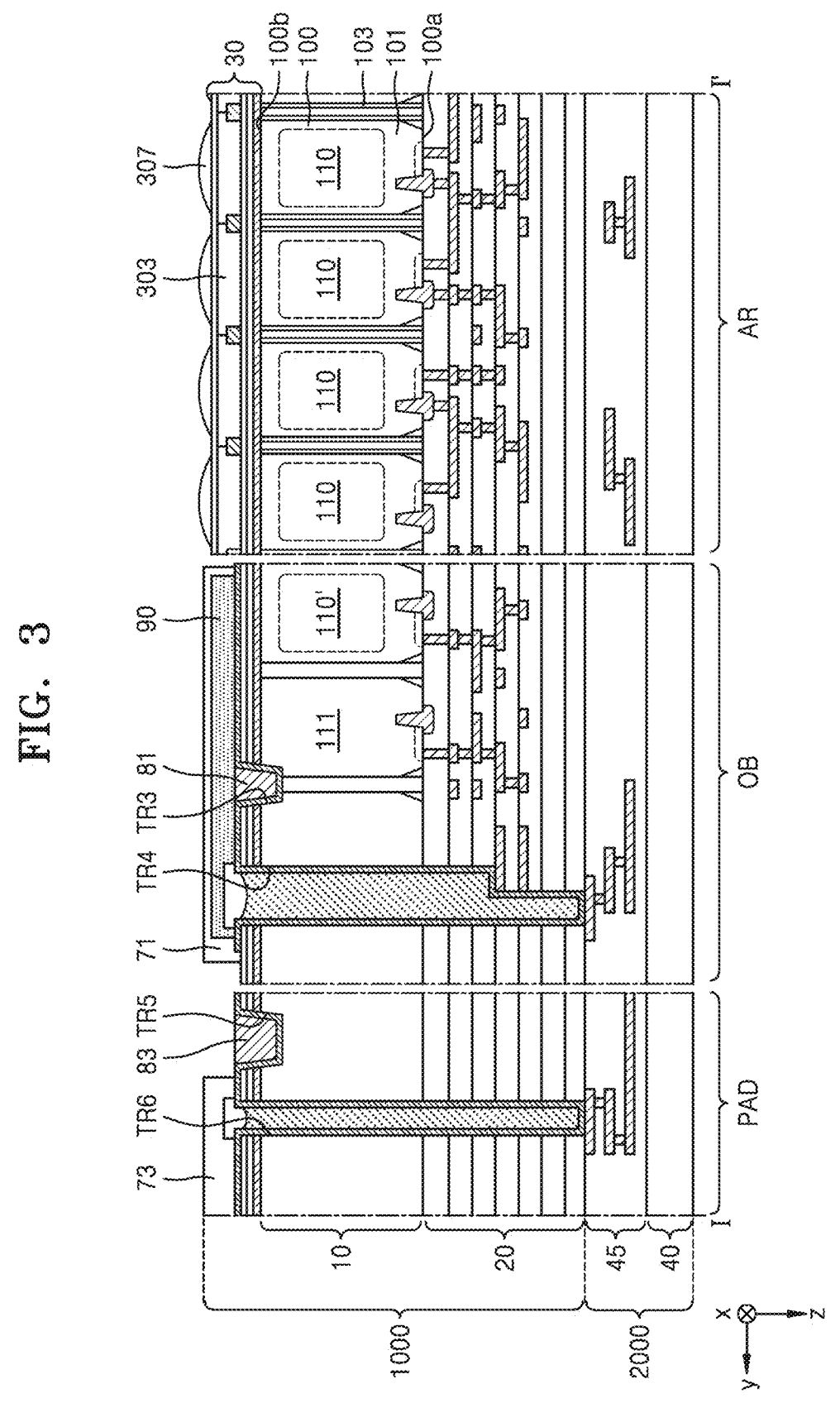

FIG. 2 is a plan view illustrating an image sensor according to some example embodiments. FIG. 3 is a cross-sectional view taken along line I-I' of FIG. 2.

Referring to FIGS. 2 and 3, an image sensor may include a sensor chip 1000 and a logic chip 2000. The sensor chip 1000 may include a photoelectric conversion layer 10, a first wiring layer 20, and a light transmission layer 30. The photoelectric conversion layer 10 may include a substrate 100, an isolation pattern 103, unit pixel regions 101 provided in the substrate 100, and photoelectric conversion regions 110 respectively provided in the unit pixel regions 101. Light incident from the outside may be converted into electrical signals in the photoelectric conversion regions 110.

The substrate 100 may include a pixel array region AR, an optical black region OB, and a pad region PAD in a plan view. The pixel array region AR may be disposed in the center portion of the substrate 100 in a plan view. The pixel array region AR may include a plurality of unit pixel regions PX. The unit pixel regions PX may output photoelectric signals from incident light. The unit pixel regions PX form columns and rows and may be two-dimensionally arranged. The columns may be parallel to a first horizontal direction (x direction). The rows may be parallel to a second horizontal direction (y direction). In some example embodiments, the first horizontal direction (x direction) may be parallel to a first surface 100*a* of the substrate 100. The second horizontal direction (y direction) may be parallel to the first surface 100*a* of the substrate 100 and may be different from the first horizontal direction (x direction). For example, the second horizontal direction (y direction) may be substantially perpendicular to the first horizontal direction (x direction). A third direction (z direction) may be substantially perpendicular to the first surface 100*a* of the substrate 100.

The pad region PAD is provided on an edge portion of the substrate 100 and may surround the pixel array region AR in a plan view. Second pad terminals 83 may be provided on the pad region PAD. The second pad terminals 83 may output electrical signals generated in the unit pixel regions PX to the outside. Alternatively, an external electrical signal or a voltage may be transferred to the unit pixel regions PX through the second pad terminals 83. Because the pad region PAD is disposed on the edge portion of the substrate 100, the second pad terminals 83 may be easily connected to the outside.

The optical black region OB may be between the pixel array region AR and the pad region PAD of the substrate 100. The optical black region OB may surround the pixel array region AR in a plan view. The optical black region OB may include a plurality of dummy regions 111. A signal generated in the dummy region 111 may be used as information for removing process-noise in a subsequent process.

Hereinafter, referring to FIG. 4, the pixel array region AR of the image sensor is described in detail.

Figure 4:
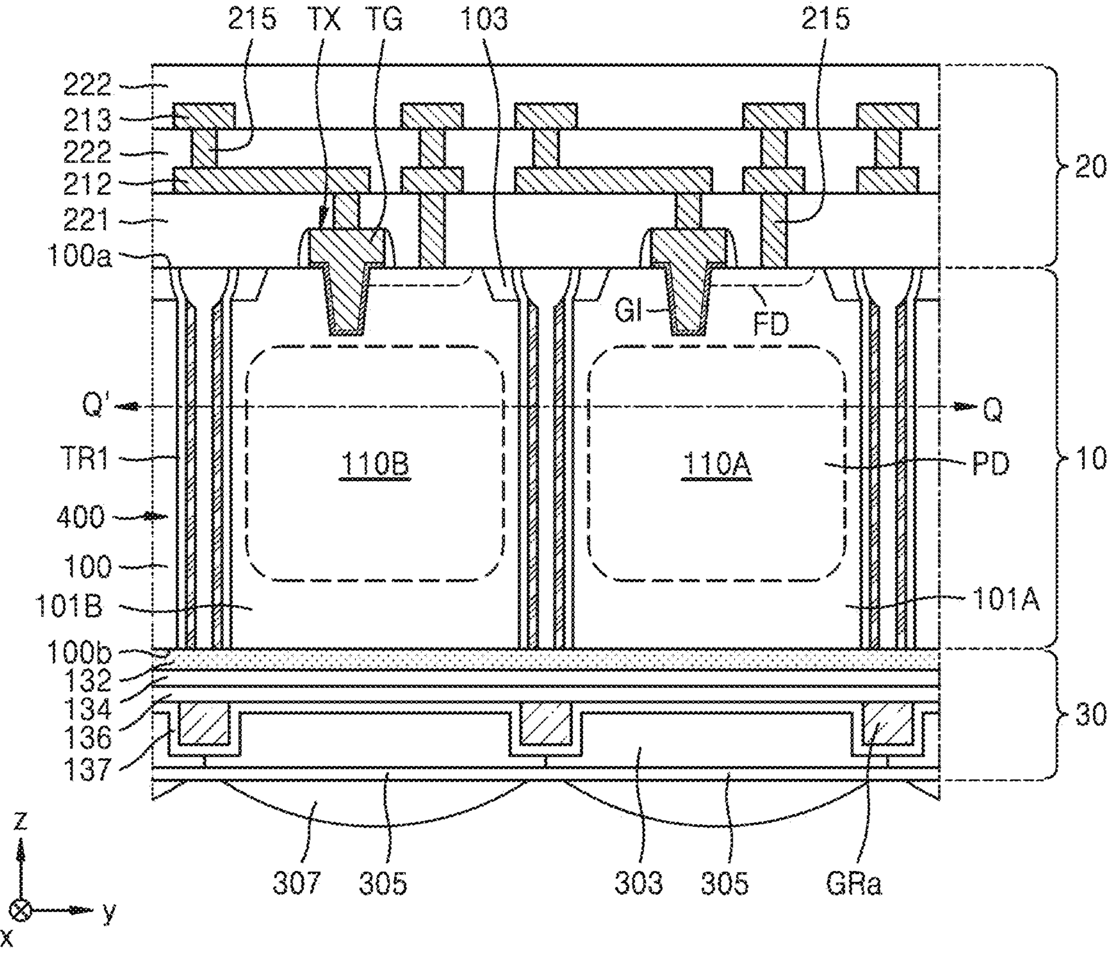
FIG. 4 is an enlarged cross-sectional view of a pixel array region of an image sensor according to some example embodiments.

FIG. 4 is an enlarged cross-sectional view of a pixel array region of an image sensor according to some example embodiments.

Referring to FIG. 4, an image sensor according to example embodiments may include a photoelectric conversion layer 10, a first wiring layer 20, and a light transmission layer 30. The photoelectric conversion layer 10 may include a substrate 100, a pixel isolation region 400, and an isolation pattern 103.

The substrate 100 may have a first surface 100*a* (which also may be referred to as a front surface) and a second surface 100*b* (which also may be referred to as a rear surface) facing each other. Light may be incident on the second surface 100*b* of the substrate 100. The first wiring layer 20 may be disposed on the first surface 100*a* of the substrate 100, and the light transmission layer 30 may be disposed on the second surface 100*b* of the substrate 100. The substrate 100 may include a semiconductor substrate or a silicon on insulator (SOI) substrate. The semiconductor substrate may include, for example, a silicon substrate, a germanium substrate, or a silicon-germanium substrate. The substrate 100 may include an impurity of the first conductivity type. For example, the first conductivity type impurity may include a p-type impurity, such as aluminum (Al), boron (B), indium (In), and/or gallium (Ga).

The substrate 100 may include unit pixel regions 101A and 101B including photoelectric conversion regions 110A and 110B. The photoelectric conversion regions 110A and 110B may be partial regions of the photoelectric conversion regions 110 described with reference to FIG. 3. The unit pixel regions 101A and 101B may be partial regions of the unit pixel regions 101 described with reference to FIG. 3. The photoelectric conversion regions 110A and 110B may be respectively provided in the unit pixel regions PX in the substrate 100. The photoelectric conversion regions 110A and 110B may perform the same function and role as the photoelectric conversion region PD of FIG. 1. The photoelectric conversion regions 110A and 110B may be regions doped with an impurity of the second conductivity type in the substrate 100. The impurity of the second conductivity type may have a conductivity type opposite to that of the impurity of the first conductivity type. The impurity of the second conductivity type may include an n-type impurity such as phosphorus, arsenic, bismuth, and/or antimony. The photoelectric conversion regions 110A and 110B may be adjacent to the first surface 100*a* of the substrate 100. For example, the photoelectric conversion regions 110 may be disposed closer to the first surface 100*a* than to the second surface 100*b* of the substrate 100. For example, each of the photoelectric conversion regions 110A and 110B may include a first region adjacent to the first surface 100*a* and a second region adjacent to the second surface 100*b*. There may be a difference in impurity concentration between the first and second regions of the photoelectric conversion regions 110A and 110B. Accordingly, the photoelectric conversion regions 110A and 110B may have a potential gradient between the first surface 100*a* and the second surface 100*b* of the substrate 100. As another example, the photoelectric conversion regions 110A and 110B may not have a potential gradient between the first surface 100*a* and the second surface 100*b* of the substrate 100.

The substrate 100 and the photoelectric conversion regions 110A and 110B may configure a photodiode. That is, a photodiode may be configured by a p-n junction between the substrate 100 of the first conductivity type and the photoelectric conversion regions 110A and 110B of the second conductivity type. The photoelectric conversion regions 110A and 110B constituting the photodiode may generate and accumulate photocharges in proportion to the intensity of incident light.

As shown in FIG. 4, a pixel isolation region 400 is provided in the substrate 100 and may define unit pixel regions 101. For example, the pixel isolation region 400 may be provided between unit pixel regions 101 of the substrate 100. From a plan view, the pixel isolation region 400 may have a lattice structure. From a plan view, the pixel isolation region 400 may completely surround each of the unit pixel regions 101. The pixel isolation region 400 may be provided in a pixel isolation trench TR, and the pixel isolation trench TR may be recessed from the first surface 100*a* of the substrate 100. The pixel isolation region 400 may extend from the first surface 100*a* of the substrate 100 toward the second surface 100*b*. The pixel isolation region 400 may be a deep trench isolation film. The pixel isolation region 400 may pass through the substrate 100. A vertical height of the pixel isolation region 400 may be substantially equal to a vertical thickness of the substrate 100. For example, a width of the pixel isolation region 400 may gradually decrease from the first surface 100*a* to the second surface 100*b* of the substrate 100. A more detailed description of the pixel isolation region 400 is given below.

According to some example embodiments, the isolation pattern 103 may be provided in the substrate 100. A lower surface of the isolation pattern 103 may be provided in the substrate 100. A width of the isolation pattern 103 may gradually decrease from the first surface 100*a* to the second surface 100*b* of the substrate 100. At least a portion of the isolation pattern 103 is disposed on an upper sidewall of the pixel isolation region 400 and may be connected to the upper sidewall of the pixel isolation region 400. A depth of the isolation pattern 103 may be less than a depth of the pixel isolation region 400. The isolation pattern 103 may include, for example, silicon oxide, silicon nitride, and/or silicon oxynitride.

The transfer transistor TX described above with reference to FIG. 1 may be provided on the first surface 100*a* of the substrate 100. The transfer transistor TX may be electrically connected to the photoelectric conversion regions 110A and 110B.

According to some example embodiments, the first wiring layer 20 may include wiring insulating layers 221 and 222, wirings 212 and 213, and vias 215. The wiring insulating layers may include a first wiring insulating layer 221 and second wiring insulating layers 222. The first wiring insulating layer 221 may cover the first surface 100*a* of the substrate 100. The first wiring insulating layer 221 may be provided between the wirings 212 and 213 and the first surface 100*a* of the substrate 100. The second wiring insulating layer 222 may be stacked on the first wiring insulating layer 221. The first and second wiring insulating layers 221 and 222 may include a non-conductive material. For example, the first and second wiring insulating layers 221 and 222 may include a silicon-based insulating material, such as silicon oxide, silicon nitride, and/or silicon oxynitride.

The wirings 212 and 213 may be provided on the first wiring insulating layer 221. For example, the wirings 212 and 213 may be disposed in the second wiring insulating layers 222 stacked on the first surface 100*a* of the substrate 100. The wirings 212 and 213 may be vertically connected to the transfer transistor TX through the vias 215. Electrical signals converted from the photoelectric conversion regions

110 may be signal processed in the first wiring layer 20. In some example embodiments of the inventive concepts, the arrangement of the wirings 212 and 213 may be arranged regardless of the arrangement of the photoelectric conversion regions 110. That is, the wirings 212 and 213 may cross an upper side of the photoelectric conversion regions 110. The wirings may include first wirings 212 and second wirings 213. The first and second wirings 212 and 213 and the vias 215 may include a metal material, such as copper (Cu) or tungsten (W).

The light transmission layer 30 may include color filters 303 and micro lenses 307. The light transmission layer 30 may condense and filter light incident from the outside and provide the light to the photoelectric conversion layer 10.

Specifically, the color filters 303 and the micro lenses 307 may be provided on the second surface 100*b* of the substrate 100. The color filters 303 may be respectively disposed on the unit pixel regions PX. The micro lenses 307 may be respectively disposed on the color filters 303. A rear insulating film 132 and first auxiliary insulating films 134 and 136 may be between the second surface 100*b* of the substrate 100 and the color filters 303. The rear insulating film 132 may cover the second surface 100*b* of the substrate 100. The rear insulating film 132 may contact the second surface 100*b* of the substrate 100. The rear insulating film 132 may include, for example, at least one of a bottom antireflective coating (BARC) layer, a fixed charge layer, an adhesive layer, and a protective layer. When the rear insulating film 132 functions as a lower anti-reflection layer, the rear insulating film 132 may prevent or reduce the reflection of light incident on the second surface 100*b* of the substrate 100 so that the light may smoothly reach the photoelectric conversion regions 110. The rear insulating film 132 and the first auxiliary insulating films 134 and 136 may include a metal oxide (e.g., aluminum oxide or hafnium oxide) or a silicon-based insulating material (e.g., silicon oxide or silicon nitride). A second auxiliary insulating film 305 may be between the color filters 303 and the micro lenses 307.

The color filters 303 may include primary color filters. The color filters 303 may include first to third color filters having different colors. For example, the first to third color filters respectively may include green, red, and blue color filters. The first to third color filters may be arranged in a Bayer pattern. As another example, the first to third color filters may include other colors, such as cyan, magenta, or yellow. A grid pattern GRa may be between the color filters 303.

The micro lenses 307 may be respectively disposed on lower surfaces of the color filters 303. The micro lenses 307 may vertically overlap the photoelectric conversion regions 110A and 110B, respectively. Unlike shown in FIG. 4, the micro lenses 307 may be connected to each other. The micro lenses 307 are transparent and may transmit light. The micro lenses 307 may have a convex shape to condense light incident to the unit pixel regions PX. The micro lenses 307 may include an organic material. For example, the micro lenses 307 may include a photoresist material or a thermosetting resin.

The image sensor may further include a passivation film 137. The passivation film 137 may be between the first auxiliary insulating film 136 and the color filters 303 and between the grid pattern GRa and the color filters 303. The passivation film 137 may include an insulating material, such as a high dielectric material. For example, the passivation film 137 may include aluminum oxide or hafnium oxide.

Figure 5A:
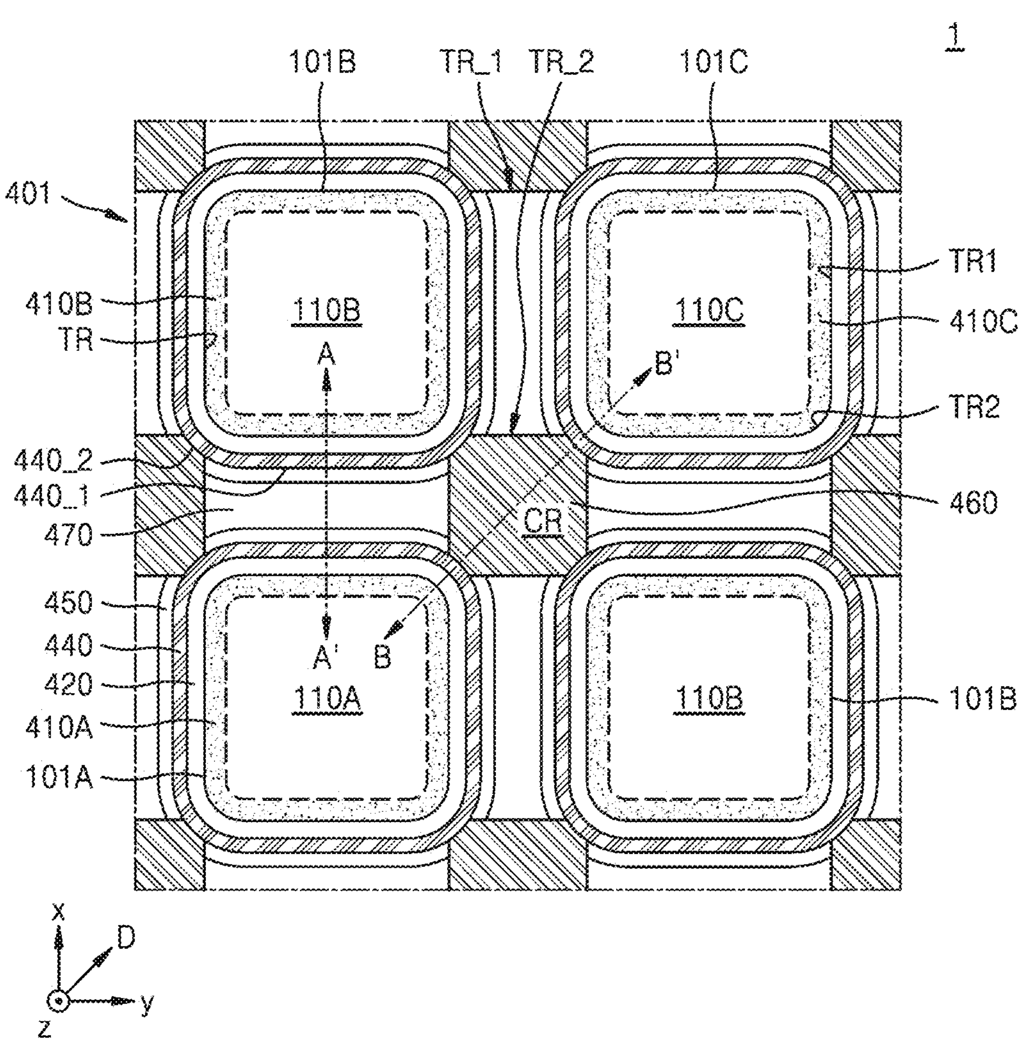
FIG. 5A is a plan view of a pixel array region of an image sensor according to some example embodiments.
Figure 5B:
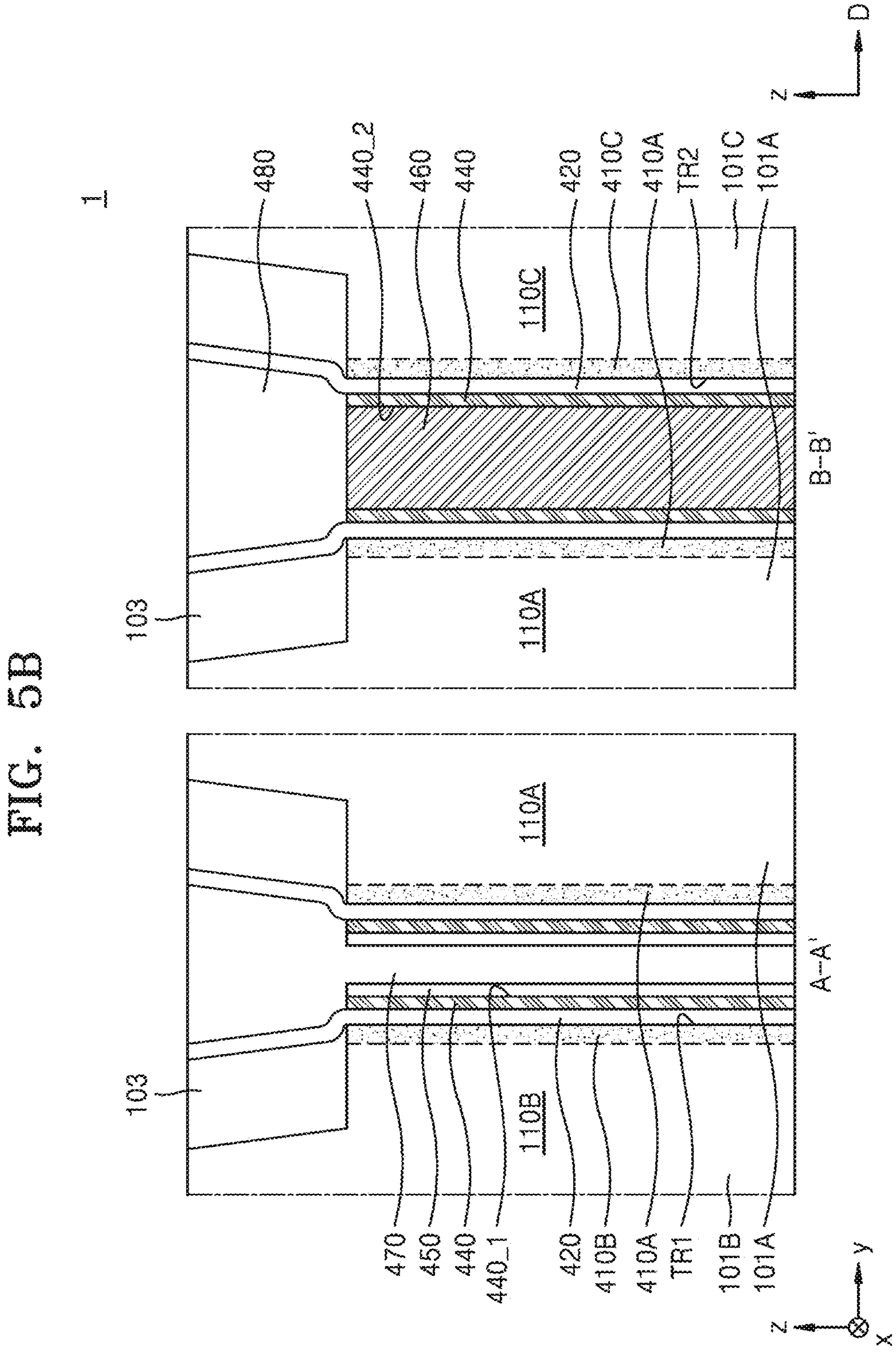
FIG. 5B is an enlarged cross-sectional view of a pixel array region of the image sensor of FIG. 5A.

FIG. 5A is a plan view of a pixel array region of an image sensor 1 according to some example embodiments. For example, FIG. 5A is a plan view corresponding to line Q-Q' of FIG. 4. FIG. 5B is a cross-sectional view of a pixel array region of the image sensor 1 shown in FIG. 5A.

Referring to FIGS. 5A and 5B, a plurality of photoelectric conversion regions, for example, first to third photoelectric conversion regions 110A, 110B, and 110C may be arranged in a lattice structure in a photoelectric conversion layer 10. The plurality of photoelectric conversion regions 110A, 110B, and 110C may be disposed in the plurality of unit pixel regions 101A, 101B, and 101C, respectively. Based on the first photoelectric conversion region 110A, the second photoelectric conversion region 110B may be disposed in a first horizontal direction (X direction) parallel to the first surface 100*a* of the substrate 100 and a second horizontal direction (Y direction) perpendicular to the first horizontal direction (X direction). In addition, the third photoelectric conversion region 110C may be disposed in a diagonal direction (direction D) of the first photoelectric conversion region 110A. The diagonal direction (direction D) may be a third horizontal direction crossing the first horizontal direction (X direction) and the second horizontal direction (Y direction). That is, the third photoelectric conversion region 110C may be disposed not to overlap the first photoelectric conversion region 110A in the first horizontal direction (X direction) and the second horizontal direction (Y direction).

In some example embodiments, a pixel isolation structure 401 disposed in the vertical direction (Z direction) within the substrate 100 may define a plurality of unit pixel regions 101A, 101B, and 101C. In some example embodiments, the pixel isolation structure 401 may be disposed surrounding each of the plurality of unit pixel regions 101A, 101B, and 101C. In some example embodiments, the pixel isolation structure 401 may be disposed surrounding each of the plurality of photoelectric conversion regions 110A, 110B, and 110C. The pixel isolation structure 401 may be between each of the plurality of photoelectric conversion regions 110A, 110B, and 110C. The pixel isolation structure 401 may have a lattice shape between each of the plurality of photoelectric conversion regions 110A, 110B, and 110C arranged in a lattice structure. The pixel isolation structure 401 may extend in the first horizontal direction (X direction) and the second horizontal direction (Y direction) between each of the plurality of photoelectric conversion regions 110A, 110B, and 110C arranged in a lattice structure.

The pixel isolation structure 401 may be disposed in the pixel isolation trench TR that penetrates through the substrate 100 in a vertical direction (Z direction). In some example embodiments, the pixel isolation trench TR may define each of the plurality of unit pixel regions 101A, 101B, and 101C, and may be disposed to surround each of the plurality of unit pixel regions 101A, 101B, and 101C. In some example embodiments, the pixel isolation trench TR may surround each of the plurality of photoelectric conversion regions 110A, 110B, and 110C and may be between each of the plurality of photoelectric conversion regions 110A, 110B, and 110C. In some example embodiments, the pixel isolation trench TR may have a lattice shape between each of the plurality of photoelectric conversion regions 110A, 110B, and 110C arranged in a lattice structure. In some example embodiments, the pixel isolation trench TR may extend in the first horizontal direction (X direction) and the second horizontal direction (Y direction).

In some example embodiments, the pixel isolation structure 401 may include a dielectric layer 420 disposed on an inner wall of the pixel isolation trench TR. The dielectric layer 420 may include at least one of $SiO_2$, $Si_3N_4$, SiCN, SiOCN, and SiON. For example, the dielectric layer 420 may be a monolayer film including $SiO_2$. For example, the dielectric layer 420 may be a multilayer film including at least one of $SiO_2$, $Si_3N_4$, SiCN, SiOCN, and SiON. In some example embodiments, the dielectric layer 420 may have a thickness in a range from about or exactly 1 nm to about or exactly 200 nm.

In some example embodiments, the pixel isolation structure 401 may include a first semiconductor pattern 440 conformally disposed on the dielectric layer 420. The first semiconductor pattern 440 may be conformally disposed on a portion of the dielectric layer 420. For example, the first semiconductor pattern 440 may not be disposed on an upper portion of the pixel isolation trench TR disposed in the isolation pattern 103. In some example embodiments, the upper portion of the pixel isolation trench TR is a portion disposed within the isolation pattern 103 and may denote a portion having a horizontal width that is greater than that of a lower portion that is not disposed within the isolation pattern 103. That is, the first semiconductor pattern 440 may be disposed in the lower portion of the pixel isolation trench TR. That is, a vertical length of the first semiconductor pattern 440 may be less than a vertical length of the dielectric layer 420. The first semiconductor pattern 440 may include a first dopant. In some example embodiments, the first dopant may include a P-type dopant. For example, the first dopant may include at least one of boron (B), aluminum (Al), and indium (In). In some example embodiments, the first semiconductor pattern 440 may have a thickness in a range from about or exactly 1 nm to about or exactly 50 nm.

In some example embodiments, the pixel isolation structure 401 may include a first insulating layer 450 and a second semiconductor pattern 460 disposed on the first semiconductor pattern 440. That is, the first insulating layer 450 and the second semiconductor pattern 460 may be disposed in the lower portion of the pixel isolation trench TR. That is, the first insulating layer 450 and the second semiconductor pattern 460 may not be disposed in the upper portion of the pixel isolation trench TR. For example, the pixel isolation structure 401 may include the first insulating layer 450 disposed on a first portion 440_1 of the first semiconductor pattern 440 and the second semiconductor pattern 460 disposed on a second portion 440_2 of the first semiconductor pattern 440. In some example embodiments, the second semiconductor pattern 460 may fill the lower portion of the pixel isolation trench TR on the second portion 440_2 of the first semiconductor pattern 440.

In some example embodiments, the first portion 440_1 of the first semiconductor pattern 440 may be a portion disposed between the first photoelectric conversion region 110A and the second photoelectric conversion region 110B. For example, the first portion 440_1 of the first semiconductor pattern 440 may be a portion that overlaps the first photoelectric conversion region 110A and the second photoelectric conversion region 110B in the first horizontal direction (X direction) or in the second horizontal direction (Y direction). In some example embodiments, the first portion 440_1 of the first semiconductor pattern 440 may be a portion disposed between the third photoelectric conversion region 110C and the second photoelectric conversion region 110B. For example, the first portion 440_1 of the first semiconductor pattern 440 may be a portion that overlaps the third photoelectric conversion region 110C and the second photoelectric conversion region 110B in the first horizontal direction (X direction) or in the second horizontal direction (Y direction). In some example embodiments, the first portion 440_1 of the first semiconductor pattern 440 may include a portion extending in the first horizontal direction (X direction) or the second horizontal direction (Y direction). In some example embodiments, the first portion 440_1 of the first semiconductor pattern 440 may be a portion except for the second portion 440_2 of the first semiconductor pattern 440.

In some example embodiments, the second portion 440_2 of the first semiconductor pattern 440 may be a portion disposed between the first photoelectric conversion region 110A and the third photoelectric conversion region 110C. For example, the second portion 440_2 of the first semiconductor pattern 440 may be a portion that overlaps the first photoelectric conversion region 110A with the third photoelectric conversion region 110C in the diagonal direction (direction D). For example, the second portion 440_2 of the first semiconductor pattern 440 may be a portion that does not overlap the first and third photoelectric conversion regions 110A and 110C in the first horizontal direction (X direction) and in the second horizontal direction (Y direction). In some example embodiments, the second portion 440_2 of the first semiconductor pattern 440 may be a portion disposed between the plurality of second photoelectric conversion regions 110B. For example, the second portion 440_2 of the first semiconductor pattern 440 may be a portion that overlaps each of the plurality of second photoelectric conversion regions 110B in a vertical direction of a diagonal direction (D direction). For example, the second portion 440_2 of the first semiconductor pattern 440 does not overlap each of the plurality of second photoelectric conversion regions 110B in the first horizontal direction (X direction) and in the second horizontal direction (Y direction).

In some example embodiments, the first insulating layer 450 disposed on the first portion 440_1 of the first semiconductor pattern 440 may include an insulating material. For example, the first insulating layer 450 may include silicon nitride. The first insulating layer 450 may perform to diffuse the first dopant of the first semiconductor pattern 440 in only one direction. For example, the first insulating layer 450 may perform as a barrier film that allows the first dopant of the first semiconductor pattern 440 to diffuse only into the photoelectric conversion regions 110A, 110B, and 110C and not to diffuse in an opposite direction. In some example embodiments, the first insulating layer 450 may have a thickness in a range from about or exactly 1 nm to about or exactly 100 nm.

In some example embodiments, the second semiconductor pattern 460 disposed on the second portion 440_2 of the first semiconductor pattern 440 may include a conductive material. For example, the second semiconductor pattern 460 may include undoped polysilicon. The second semiconductor pattern 460 may be formed on the first semiconductor pattern 440 to mediate an electrical connection between the plurality of first semiconductor patterns 440. In some example embodiments, the second semiconductor pattern 460 may contact the first insulating layer 450.

In some example embodiments, the pixel isolation trench TR may include a first region TR_1 and a second region TR_2. The first region TR_1 and the second region TR_2 may be horizontally disposed within the pixel isolation trench TR. In some example embodiments, the first insulating layer 450 may be disposed on the first semiconductor pattern 440 and in the first region TR_1. In some example embodiments, the second semiconductor pattern 460 may be disposed in the second region TR_2 on the first semiconductor pattern 440.

In some example embodiments, the first region TR_1 of the pixel isolation trench TR may be a region between the first photoelectric conversion region 110A and the second photoelectric conversion region 110B. For example, the first region TR_1 of the pixel isolation trench TR may be a region overlapping the first photoelectric conversion region 110A and the second photoelectric conversion region 110B in the first horizontal direction (X direction) or in the second horizontal direction (Y direction). In some example embodiments, the first region TR_1 of the pixel isolation trench TR may be a region between the third photoelectric conversion region 110C and the second photoelectric conversion region 110B. For example, the first region TR_1 of the pixel isolation trench TR may be a region overlapping the third photoelectric conversion region 110C and the second photoelectric conversion region 110B in the first horizontal direction (X direction) or in the second horizontal direction (Y direction). In some example embodiments, the first region TR_1 of the pixel isolation trench TR may include a region extending in the first horizontal direction (X direction) or the second horizontal direction (Y direction). In some example embodiments, the first region TR_1 of the pixel isolation trench TR may be a region except for the second region TR_2.

In some example embodiments, the second region TR_2 of the pixel isolation trench TR may include a central region CR. The central region CR may be a region between the first photoelectric conversion region 110A and the third photoelectric conversion region 110C. For example, the central region CR may be a region overlapping the first photoelectric conversion region 110A and the third photoelectric conversion region 110C in the diagonal direction (direction D). That is, the second region TR_2 may be between the first photoelectric conversion region 110A and the third photoelectric conversion region 110C, and may overlap with the first photoelectric conversion region 110A and the third photoelectric conversion region 110C in the diagonal direction (D direction). For example, the central region CR is a region that does not overlap with the first photoelectric conversion region 110A and the third photoelectric conversion region 110C in the first horizontal direction (X direction) and the second horizontal direction (Y direction). That is, the second region TR_2 may include a region that does not overlap with the first photoelectric conversion region 110A and the third photoelectric conversion region 110C in the first horizontal direction (X direction) and the second horizontal direction (Y direction). In some example embodiments, the central region CR may be a region between the plurality of second photoelectric conversion regions 110B. For example, the center region CR may be a region overlapping each of the plurality of second photoelectric conversion regions 110B in a vertical direction of the diagonal direction (direction D). That is, the second region TR_2 may be between the plurality of second photoelectric conversion regions 110B and may overlap each of the plurality of second photoelectric conversion regions 110B in the vertical direction of the diagonal direction (D direction). For example, the center region CR may be a region that does not overlap each of the plurality of second photoelectric conversion regions 110B in the first horizontal direction (X direction) and the second horizontal direction (Y direction). That is, the second region TR_2 may include a region that does not overlap with each of the plurality of second photoelectric conversion regions 110B in the first horizontal direction (X direction) and the second horizontal direction (Y direction). In some example embodiments, the second region TR_2 may include a portion where a lattice point of the lattice-shaped pixel isolation trench TR is located.

In some example embodiments, the pixel isolation trench TR may include a first trench region TR1 and a second trench region TR2. In some example embodiments, the first insulating layer 450 may be disposed in the first trench region TR1, and the second semiconductor pattern 460 may be disposed in the second trench region TR2. That is, the pixel isolation structure 401 disposed in the pixel isolation trench TR may include the dielectric layer 420 disposed on inner walls of the first trench region TR1 and the second trench region TR2, the first semiconductor pattern 440 disposed on the dielectric layer 420, the first insulating layer 450 disposed on the first semiconductor pattern 440 in the first trench region TR1, and the second semiconductor pattern 460 disposed on the semiconductor pattern 440 in the second trench region TR2.

In some example embodiments, the first trench region TR1 of the pixel isolation trench TR may be between the first photoelectric conversion region 110A and the second photoelectric conversion region 110B. For example, the first trench region TR1 of the pixel isolation trench TR may overlap the first photoelectric conversion region 110A and the second photoelectric conversion region 110B in the first horizontal direction (X direction) or in the second horizontal direction (Y direction). In some example embodiments, the first trench region TR1 of the pixel isolation trench TR may be between the third photoelectric conversion region 110C and the second photoelectric conversion region 110B. For example, the first trench region TR1 of the pixel isolation trench TR may overlap with the third photoelectric conversion region 110C and the second photoelectric conversion region 110B in the first horizontal direction (X direction) or in the second horizontal direction (Y direction). In some example embodiments, the first trench region TR1 of the pixel isolation trench TR may extend in the first horizontal direction (X direction) or the second horizontal direction (Y direction). That is, the first trench region TR1 may have a straight-line shape in a plan view. In some example embodiments, the first trench region TR1 of the pixel isolation trench TR may be a boundary between the first region TR_1 of the pixel isolation trench TR and the unit pixel regions 101A, 101B, and 101C. In some example embodiments, the first trench region TR1 of the pixel isolation trench TR may be a portion except for the second trench region TR2.

In some example embodiments, the second trench region TR2 of the pixel isolation trench TR may be between the first photoelectric conversion region 110A and the third photoelectric conversion region 110C. For example, the second trench region TR2 of the pixel isolation trench TR may overlap with the first photoelectric conversion region 110A and the third photoelectric conversion region 110C in the diagonal direction (direction D). For example, the second trench region TR2 of the pixel isolation trench TR may include a portion that does not overlap with the first photoelectric conversion region 110A and the third photoelectric conversion region 110C in the first horizontal direction (X direction) and in the second horizontal direction (Y direction). In some example embodiments, the second trench region TR2 of the pixel isolation trench TR may be between the plurality of second photoelectric conversion regions 110B. For example, the second trench region TR2 of the pixel isolation trench TR may overlap with each of the plurality of second photoelectric conversion regions 110B in the vertical direction of the diagonal direction (direction D).

For example, the second trench region TR2 of the pixel isolation trench TR may include a portion that does not overlap with each of the plurality of second photoelectric conversion regions 110B in the first horizontal direction (X direction) and in the second horizontal direction (Y direction). In some example embodiments, the second trench region TR2 of the pixel isolation trench TR may be a boundary between the second region TR_2 of the pixel isolation trench TR and the unit pixel regions 101A, 101B, and 101C. In some example embodiments, the second trench region TR2 may include a portion where lattice points of the pixel isolation trench TR having a lattice-shape are located.

In some example embodiments, a first buried insulating layer 470 may be disposed on the first insulating layer 450. The first buried insulating layer 470 may completely fill the pixel isolation trench TR. For example, the first buried insulating layer 470 may completely fill the first region TR_1 of the pixel isolation trench TR. For example, the first buried insulating layer 470 may completely fill the first trench region TR1 of the pixel isolation trench TR. The first buried insulating layer 470 may completely fill upper and lower portions of the pixel isolation trench TR. For example, the first buried insulating layer 470 may completely fill the pixel isolation trench TR on the first insulating layer 450 at a lower portion of the pixel isolation trench TR. For example, the first buried insulating layer 470 may completely fill the pixel isolation trench TR on the dielectric layer 420 at an upper portion of the pixel isolation trench TR. In some example embodiments, the first buried insulating layer 470 may contact the dielectric layer 420, the first semiconductor pattern 440, and the first insulating layer 450.

In some example embodiments, the first buried insulating layer 470 may include a material that is different from that of the first insulating layer 450. For example, when the first insulating layer 450 includes silicon nitride, the first buried insulating layer 470 may include silicon oxide.

In some example embodiments, a second buried insulating layer 480 may be disposed on the second semiconductor pattern 460. The second buried insulating layer 480 may completely fill the pixel isolation trench TR on a higher level of the second semiconductor pattern 460. For example, the second buried insulating layer 480 may completely fill the second region TR_2 of the pixel isolation trench TR. For example, the second buried insulating layer 480 may completely fill the second trench region TR2 of the pixel isolation trench TR. In some example embodiments, the second buried insulating layer 480 may completely fill the pixel isolation trench TR on the dielectric layer 420 at the upper portion of the pixel isolation trench TR. In some example embodiments, the second buried insulating layer 480 may contact the dielectric layer 420, the first semiconductor pattern 440, and the second semiconductor pattern 460.

In some example embodiments, the second buried insulating layer 480 may include the same material as the first buried insulating layer 470. For example, the first buried insulating layer 470 and the second buried insulating layer 480 may include silicon oxide.

In some example embodiments, the plurality of photoelectric conversion regions 110A, 110B, and 110C may include doped regions 410A, 410B, and 410C, respectively. Each of the doped regions 410A, 410B, and 410C may be doped with a first dopant. That is, the doped regions 410A, 410B, and 410C may be regions doped with at least one of boron (B), aluminum (Al), and indium (In). The doped regions 410A, 410B, and 410C may be disposed on outer walls of the pixel isolation trench TR. The doped regions 410A, 410B, and 410C may be spaced apart from the first semiconductor pattern 440 with the dielectric layer 420 therebetween. In some example embodiments, the doped regions 410A, 410B, and 410C may have a thickness in a range from about or exactly 2 nm and about or exactly 200 nm. In some example embodiments, the doping concentration of the first dopant inside the doped regions 410A, 410B, and 410C decreases towards the center of the photoelectric conversion region 110A, 110B, and 110C from an outer wall of the pixel isolation trench TR.

According to the technical spirit of the inventive concepts, in the first semiconductor pattern 440 that is conformally formed on the dielectric layer 420 and has a uniform thickness, because the doped regions 410A, 410B, and 410C are formed by diffusing the first dopant into the photoelectric conversion regions 110A, 110B, and 110C to be doped, the image sensor 1 including the doped regions 410A, 410B, and 410C having a uniform doping concentration may be provided. That is, according to the technical sprit of the inventive concepts, the image sensor 1 with improved reliability and performance may be provided.

Figure 6A:
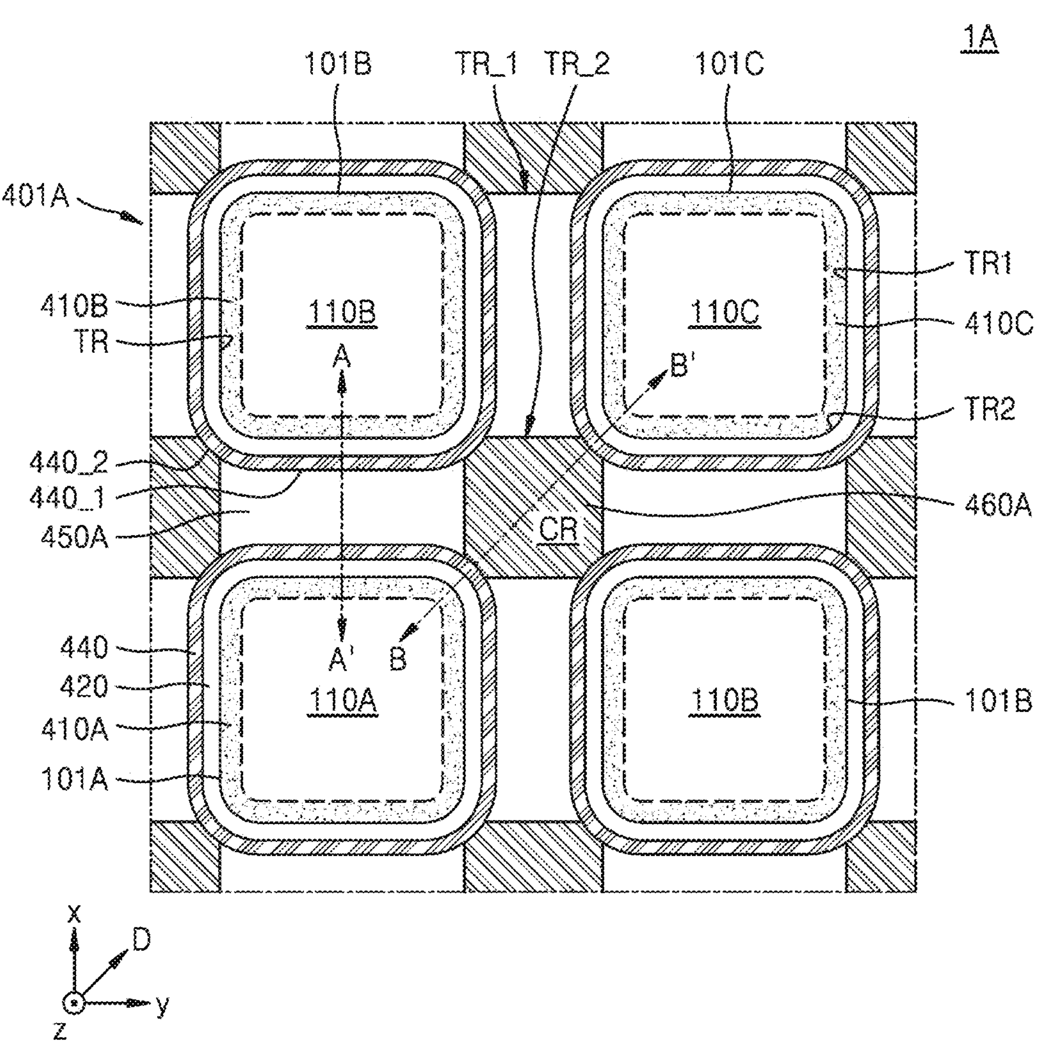
FIGS. 6A, 6B, 7A, 7B, 8A, and 8B are diagrams illustrating a pixel array region of an image sensor according to some example embodiments.
Figure 6B:
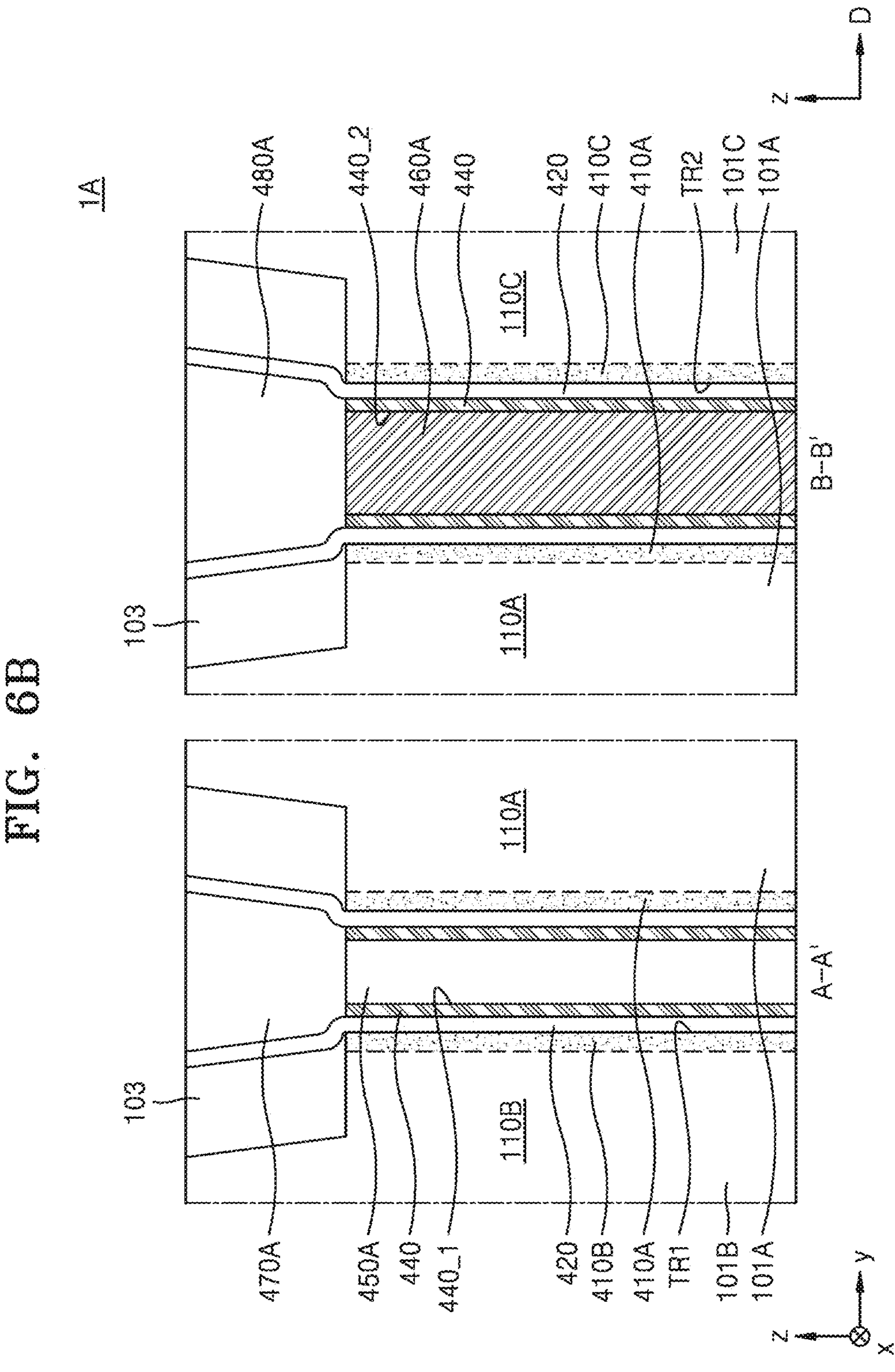
Figure 7A:
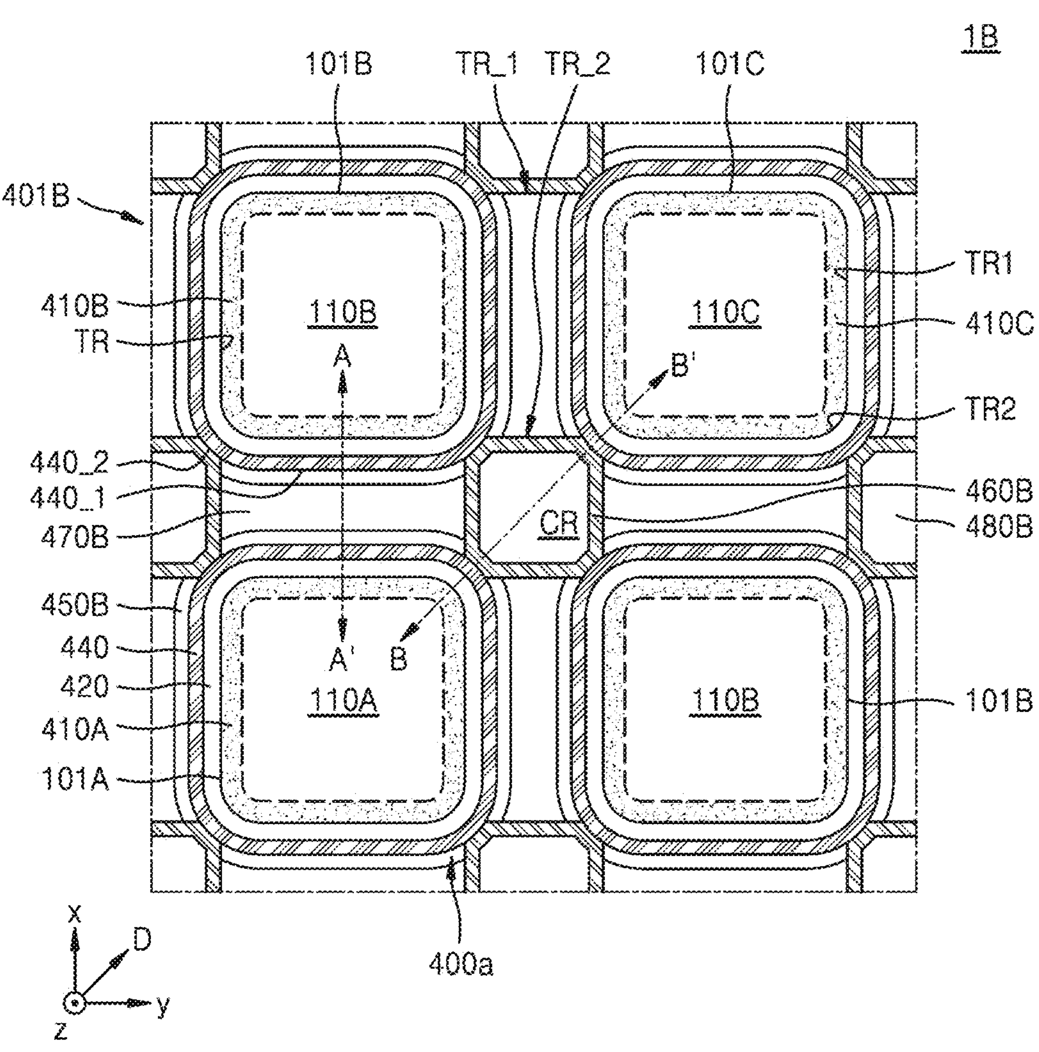
Figure 7B:
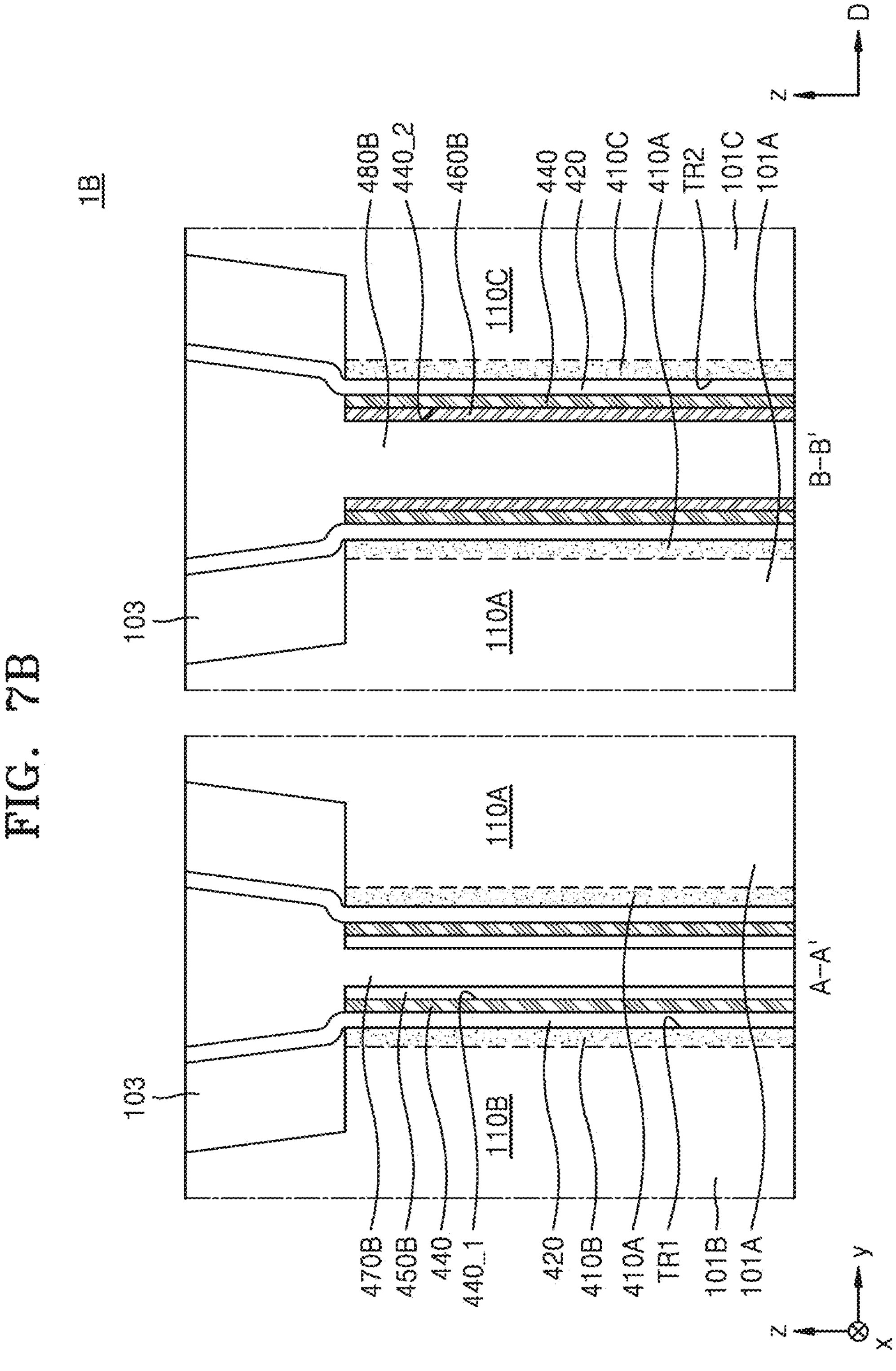
Figure 8A:
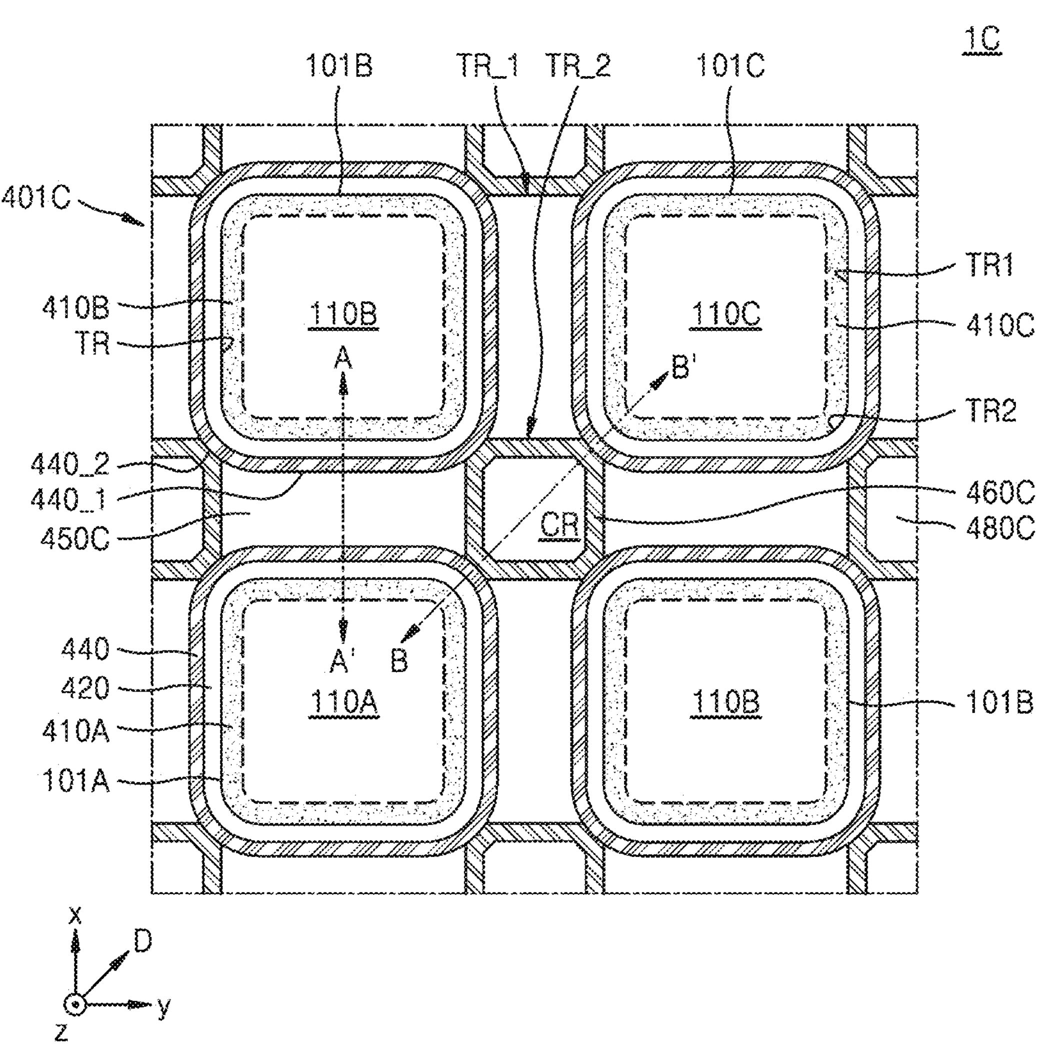
Figure 8B:
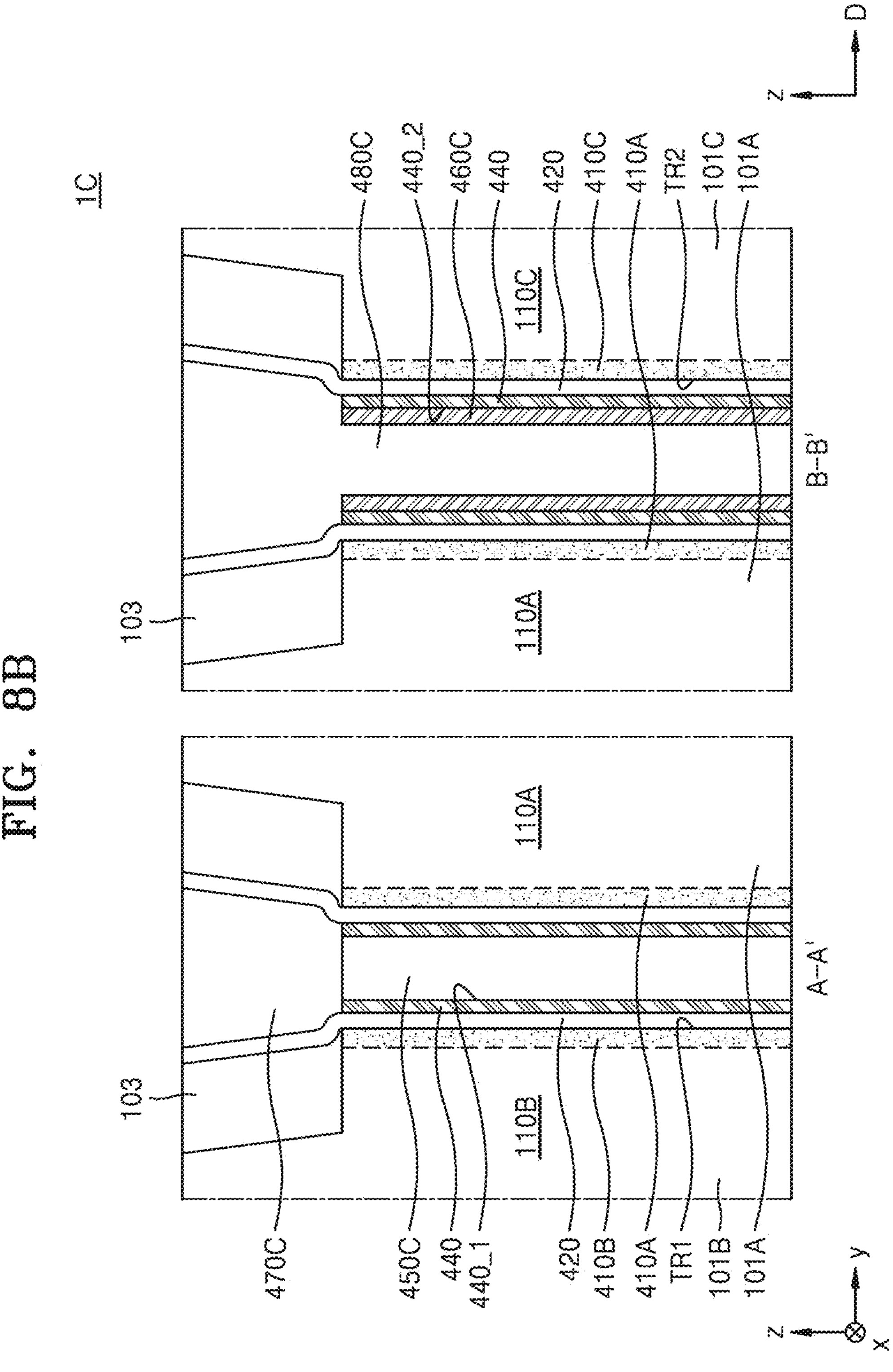
Figure 9:
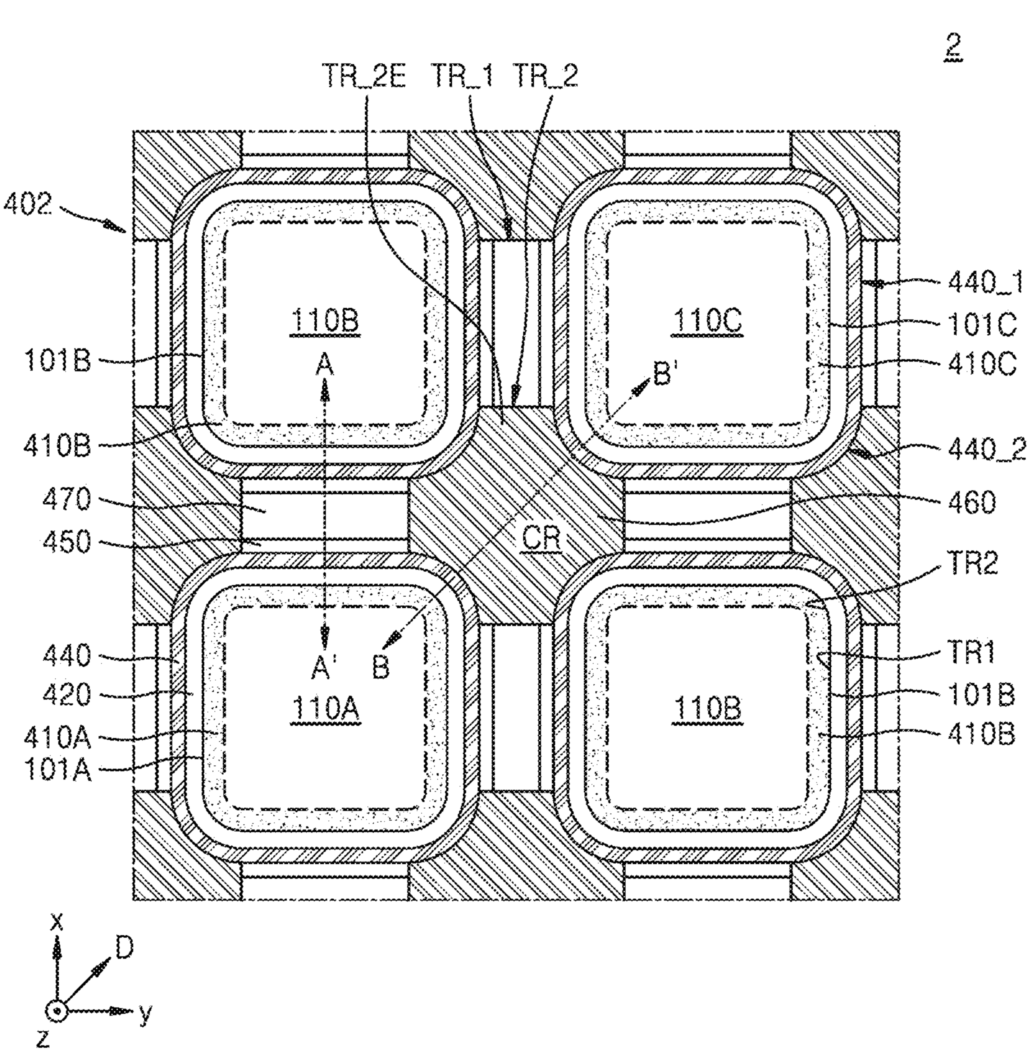
FIGS. 9, 10, 11, and 12 are plan views illustrating a pixel array region of an image sensor according to some example embodiments.
Figure 10:
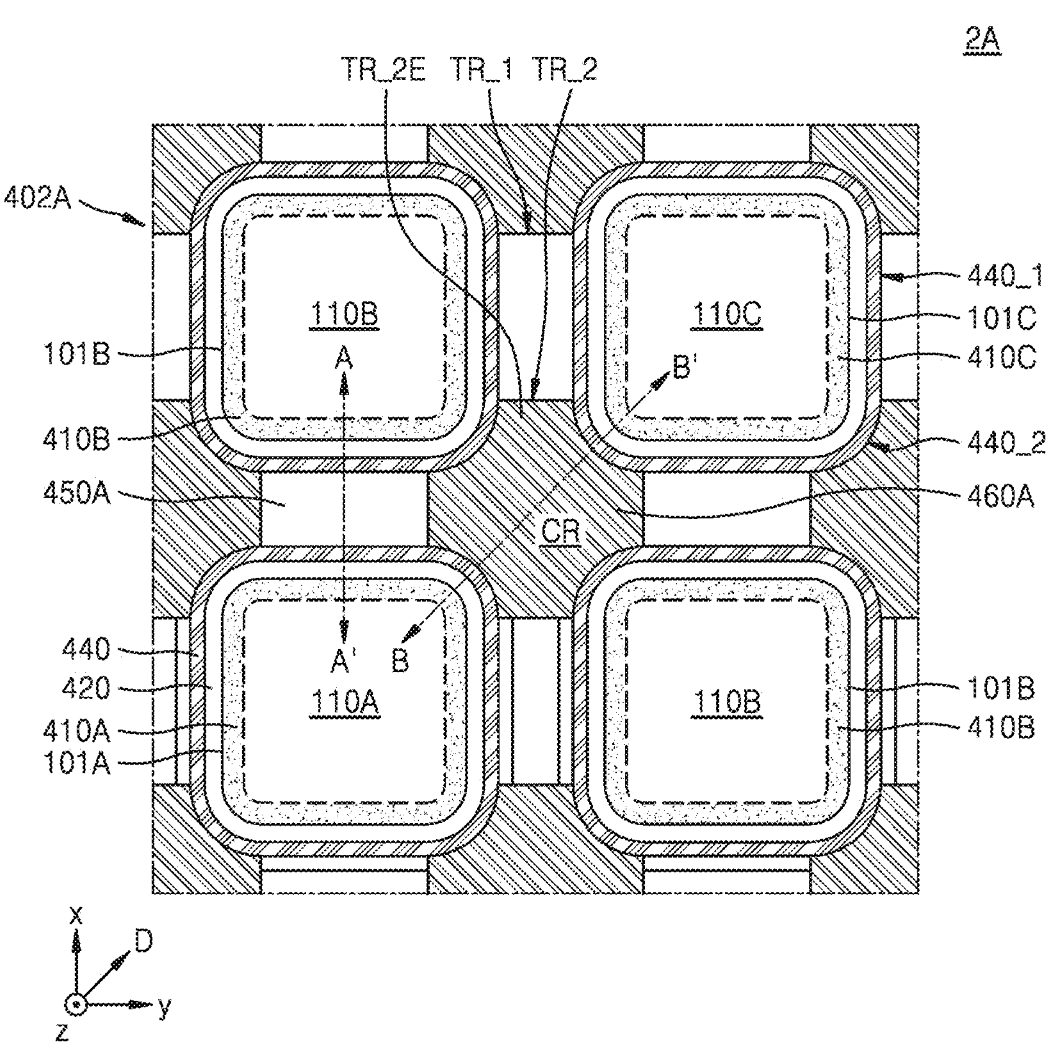
Figure 11:
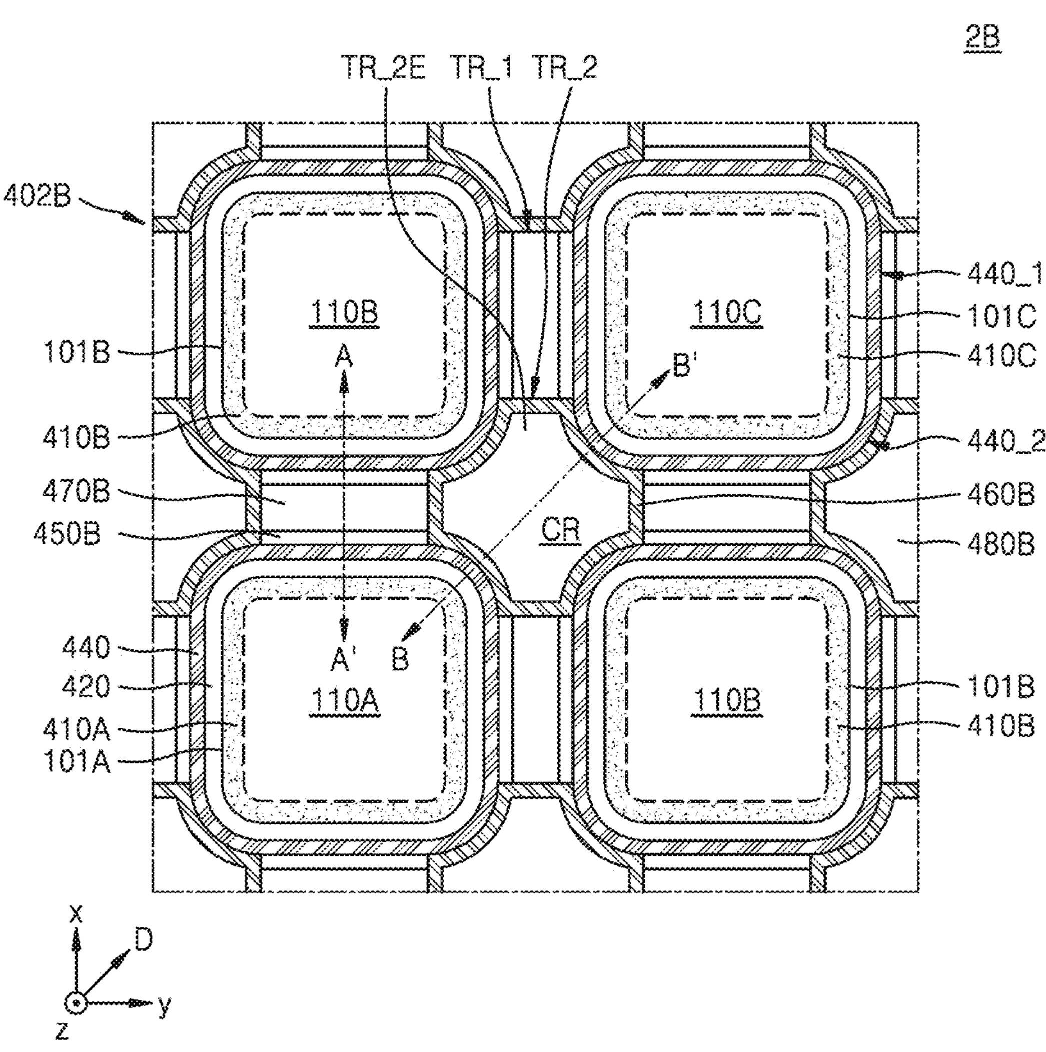
Figure 12:
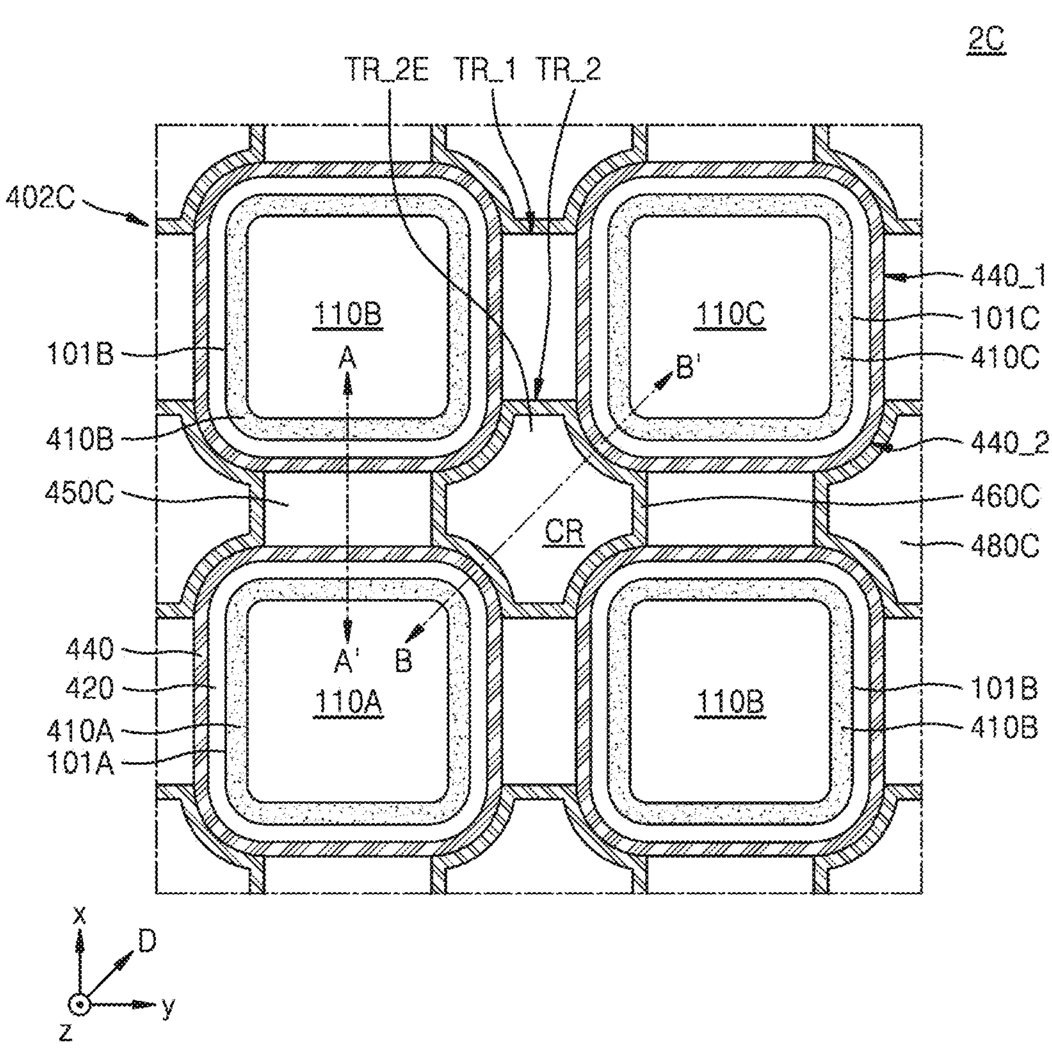

FIGS. 6A, 6B, 7A, 7B, 8A, and 8B are diagrams illustrating pixel array regions of image sensors 1A, 1B, and 1C according to some example embodiments. For example, FIGS. 6A, 7A, and 8A are plan views of pixel array regions of the image sensors 1A, 1B, and 1C according to some example embodiments, and FIGS. 6B, 7B, and 8B are respectively cross-sectional views of the pixel array regions of the image sensors 1A, 1B, and 1C shown in FIGS. 6A, 7A, and 8A. Differences from the image sensor 1 shown in FIGS. 5A and 5B are mainly described.

Referring to FIGS. 6A and 6B, the image sensor 1A may include a pixel isolation structure 401A defining a plurality of unit pixel regions 101A, 101B, and 101C.

In some example embodiments, the pixel isolation structure 401A may include a dielectric layer 420 disposed on an inner wall of the pixel isolation trench TR, a first semiconductor pattern 440 conformally disposed on the dielectric layer 420, a first insulating layer 450A disposed on a first portion 440_1 of the semiconductor pattern 440, a second semiconductor pattern 460A disposed on a second portion 440_2 of the first semiconductor pattern 440, a first buried insulating layer 470A disposed on a higher level of the first insulating layer 450A, and a second buried insulating layer 480A disposed on a higher level of the second semiconductor pattern 460A. Unlike the image sensor 1 of FIGS. 5A and 5B, the first insulating layer 450A is disposed on (and may be directly in contact with) the first portion 440_1 of the first semiconductor pattern 440 of the image sensor 1A to fill a lower portion of the pixel isolation trench TR, and the first buried insulating layer 470A may be disposed on a higher level of the first insulating layer 450A to fill an upper portion of the pixel isolation trench TR. That is, the first buried insulating layer 470A may not overlap the first insulating layer 450A in the horizontal direction and may be located at different vertical levels.

Referring to FIGS. 7A and 7B, the image sensor 1B may include a pixel isolation structure 401B defining a plurality of unit pixel regions 101A, 101B, and 101C.

In some example embodiments, the pixel isolation structure 401B may include a dielectric layer 420 disposed on an inner wall of the pixel isolation trench TR, a first semiconductor pattern 440 conformally disposed on the dielectric layer 420, a first insulating layer 450B disposed on a first portion 440_1 of the semiconductor pattern 440, a second semiconductor pattern 460B disposed on a second portion 440_2 of the first semiconductor pattern 440, a first buried insulating layer 470B disposed on the first insulating layer 450B, and a second buried insulating layer 480B disposed on the second semiconductor pattern 460B. Unlike the image sensor 1 of FIGS. 5A and 5B, the second semiconductor pattern 460B disposed on the second portion 440_2 of the first semiconductor pattern 440 of the image sensor 1B does not fill a lower portion of the pixel isolation trench TR, but the second buried insulating layer 480B disposed on the second semiconductor pattern 460B may completely fill upper and lower portions of the pixel isolation trench TR. That is, from a plan view, the second semiconductor pattern 460B may be disposed to surround the second buried insulating layer 480B in the second region TR_2 of the pixel isolation trench TR and separate the second buried insulating layer 480B from the semiconductor pattern 440 in the lower portion of the pixel isolation trench TR.

Referring to FIGS. 8A and 8B, the image sensor 1C may include a pixel isolation structure 401C defining a plurality of unit pixel regions 101A, 101B, and 101C.

In some example embodiments, the pixel isolation structure 401C may include a dielectric layer 420 disposed on an inner wall of the pixel isolation trench TR, a first semiconductor pattern 440 conformally disposed on the dielectric layer 420, a first insulating layer 450C disposed on a first portion 440_1 of the semiconductor pattern 440, a second semiconductor pattern 460C disposed on a second portion 440_2 of the first semiconductor pattern 440, a first buried insulating layer 470C disposed on a higher level of the first insulating layer 450C, and a second buried insulating layer 480C disposed on the second semiconductor pattern 460C. Unlike the image sensor 1 of FIGS. 5A and 5B, in the image sensor 1C, the first insulating layer 450C is disposed on (and may be in direct contact with) the first portion 440_1 of the first semiconductor pattern 440 to fill a lower portion of the pixel isolation trench TR, and the first buried insulating layer 470C is disposed on a higher level of the first insulating layer 450C to fill an upper portion of the pixel isolation trench TR. Unlike the image sensor 1 of FIGS. 5A and 5B, in the image sensor 1C, the second semiconductor pattern 460C disposed on the second portion 440_2 of the first semiconductor pattern 440 does not fill the lower portion of the pixel isolation trench TR, but the second buried insulating layer 480C disposed on the second semiconductor pattern 460C may completely fill upper and lower portions of the pixel isolation trench TR. That is, from a plan view, the second semiconductor pattern 460C may be disposed to surround the second buried insulating layer 480C in the second region TR_2 of the pixel isolation trench TR.

FIGS. 9, 10, 11, and 12 are plan views illustrating pixel array regions of image sensors 2, 2A, 2B, and 2C according to some example embodiments. Features similar or the same as those in the image sensors 1, 1A, 1B, and 1C shown in FIGS. 5A to 8B, with image sensor 1 corresponding to image senor 2, image sensor 1A corresponding to image sensor 2A, etc., will not be discussed in detail.

Referring to FIGS. 9 to 12, a second region TR_2 of a pixel isolation trench TR may include a central region CR and an extension region TR_2E. The extension region TR_2E may be a region extending from the central region CR in a first horizontal direction (X direction) and/or a second horizontal direction (Y direction). The extension region TR_2E may be a region adjacent to a first region TR_1 of the pixel isolation trench TR in the first horizontal direction (X direction) and/or the second horizontal direction (Y direction). The extension region TR_2E may be a region overlapping the plurality of photoelectric conversion regions 110A, 110B, and 110C in the first horizontal direction (X direction) and/or the second horizontal direction (Y direction). For example, the extension region TR_2E is between the first photoelectric conversion region 110A and the second photoelectric conversion region 110B, and may be a region overlapping the first photoelectric conversion region 110A and the second photoelectric conversion region 110B in the first horizontal direction (X direction) or the second horizontal direction (Y direction). For example, the extension region TR_2E is between the third photoelectric conversion region 110C and the second photoelectric conversion region 110B, and may be a region overlapping the third photoelectric conversion region 110C and the second photoelectric conversion region 110B in the first horizontal direction (X direction) or the second horizontal direction (Y direction).

In some example embodiments, when the extended region TR_2E extends from the central region CR in the first horizontal direction (X direction) and the second horizontal direction (Y direction), in a planar perspective, the second region TR_2 may have a cross shape. In some example embodiments, when the extended region TR_2E extends from the central region CR in one of the first horizontal direction (X direction) and the second horizontal direction (Y direction), the second region TR_2 may have a straight-line shape in a plan view.

FIGS. 13A to 13L are cross-sectional views illustrating a manufacturing process of an image sensor according to some example embodiments. For example, FIGS. 13A to 13L are diagrams illustrating a process of manufacturing the image sensor 1 shown in FIGS. 5A and 5B.

Figure 13A:
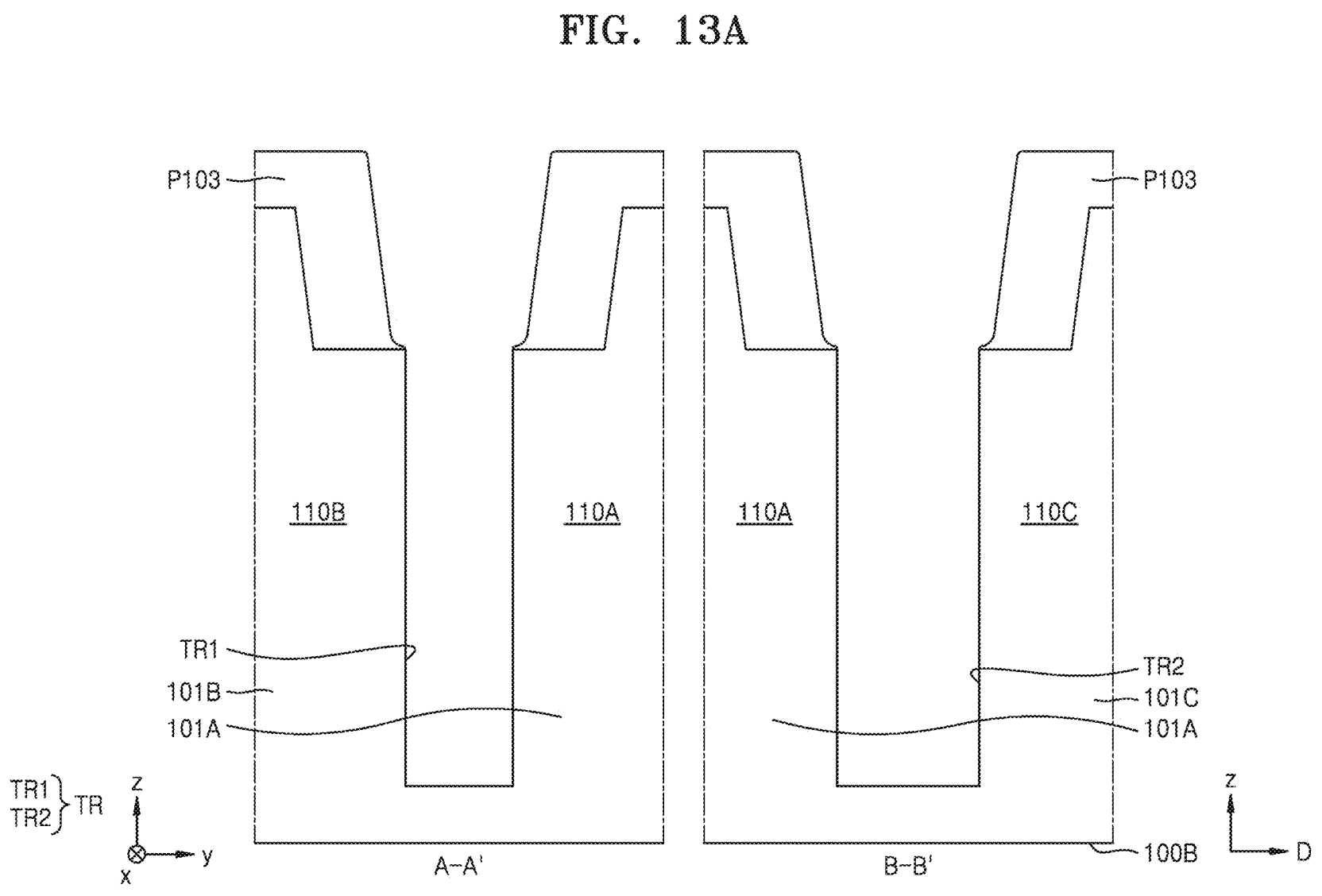

Referring to FIG. 13A, a pre-isolation pattern P103 may be formed on the substrate 100. The pre-isolation pattern P103 may include, for example, silicon oxide, silicon nitride, and/or silicon oxynitride. The pixel isolation trench TR may be formed by recessing a portion of the pre-isolation pattern P103 and the substrate 100. Due to a difference in etch selectivity between the pre-isolation pattern P103 and constituent materials of the substrate 100, upper and lower horizontal widths of the pixel isolation trench TR may be formed to be different. For example, the pixel isolation trench TR may have an upper horizontal width that is greater than a lower horizontal width.

The pixel isolation trench TR may define a plurality of unit pixel regions 101A, 101B, and 101C. The plurality of unit pixel regions 101A, 101B, and 101C may include photoelectric conversion regions 110A, 110B, and 110C, respectively.

Figure 13B:
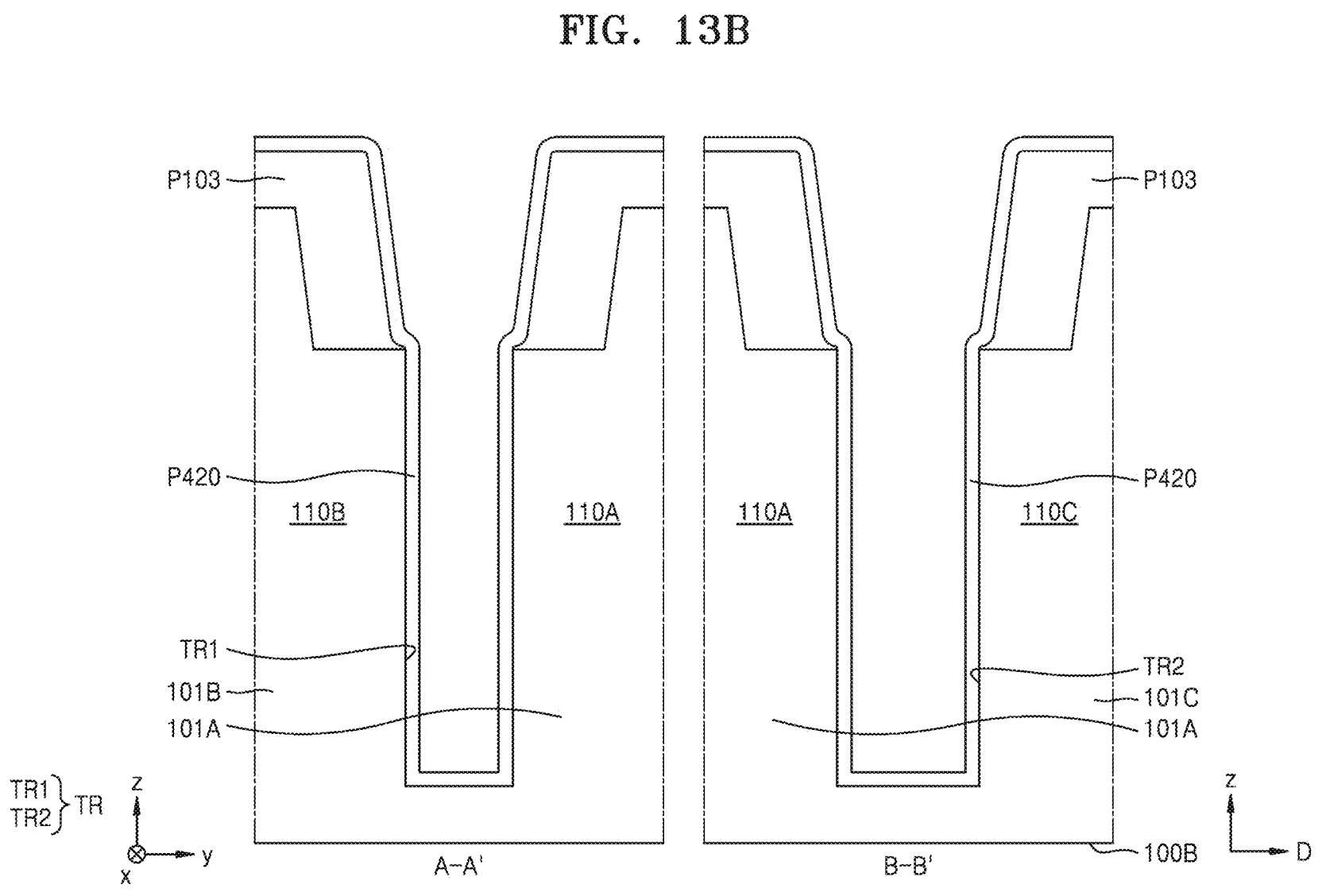

Referring to FIG. 13B, a pre-dielectric layer P420 may be formed on an inner wall of the pixel isolation trench TR. For example, the pre dielectric layer P420 may be formed on the inner walls of the first trench region TR1 and the second trench region TR2 of the pixel isolation trench TR.

In some example embodiments, the pre-dielectric layer P420 may include at least one of $SiO_2$, $Si_3N_4$, SiCN, SiOCN, and SiON. In some example embodiments, the pre-dielectric layer P420 may have a thickness in a range from about or exactly 1 nm to about or exactly 200 nm.

In some example embodiments, when the pre-dielectric layer P420 includes $SiO_2$, a $SiO_2$ film may be formed by using an atomic layer deposition (ALD) process performed at a temperature in a range from about or exactly 200° C. to about or exactly 500° C., a thermal oxidation process performing at a temperature in a range from about or exactly 630° C. to about or exactly 810° C. or a rapid thermal oxidation process performing at a temperature in a range from about or exactly 800° C. to about or exactly 1100° C.

In some example embodiments, when the pre-dielectric layer P420 includes at least one of $Si_3N_4$, SiCN, SiOCN, and SiON, a film of at least one of $Si_3N_4$, SiCN, SiOCN, and SiON may be formed by using an ALD process performing at a temperature in a range from about or exactly 450° C. to about or exactly 700° C. or a low pressure chemical vapor deposition (LPCVD) process performing at a temperature in a range from about or exactly 630° C. to about or exactly 810° C.

Figure 13C:
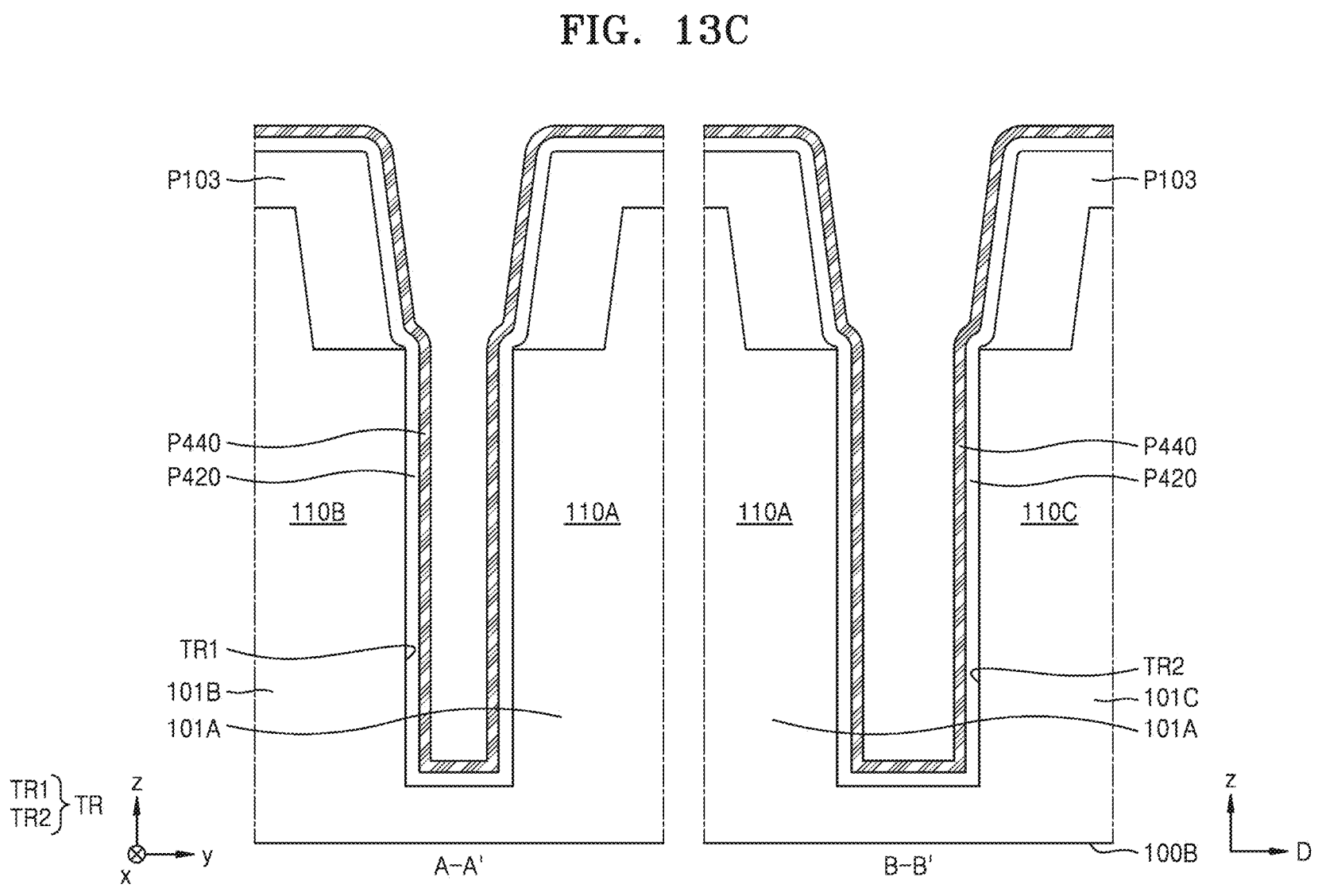

Referring to FIG. 13C, a first pre-semiconductor pattern P440 may be conformally formed on the pre-dielectric layer P420. For example, the first pre-semiconductor pattern P440 may be conformally formed in the first trench region TR1 and the second trench region TR2 of the pixel isolation trench TR. The first pre-semiconductor pattern P440 may include a first dopant. In some example embodiments, the first dopant may include a P-type dopant. For example, the first dopant may include at least one of boron (B), aluminum (Al), and indium (In). In some example embodiments, the first pre-semiconductor pattern P440 may have a thickness in a range from about or exactly 1 nm to about or exactly 50 nm.

In some example embodiments, when the first pre-semiconductor pattern P440 includes boron (B), the first pre-semiconductor pattern P440 may be formed by mixing $BCl_3$ or $B_2H_6$ with $SiH_4$ or $SiH_2$. In some example embodiments, the first pre-semiconductor pattern P440 may be formed by using an LPCVD process or a plasma enhanced chemical vapor deposition (PECVD) process performing at a temperature in a range from about or exactly 300° C. to about or exactly 530° C.

Figure 13D:
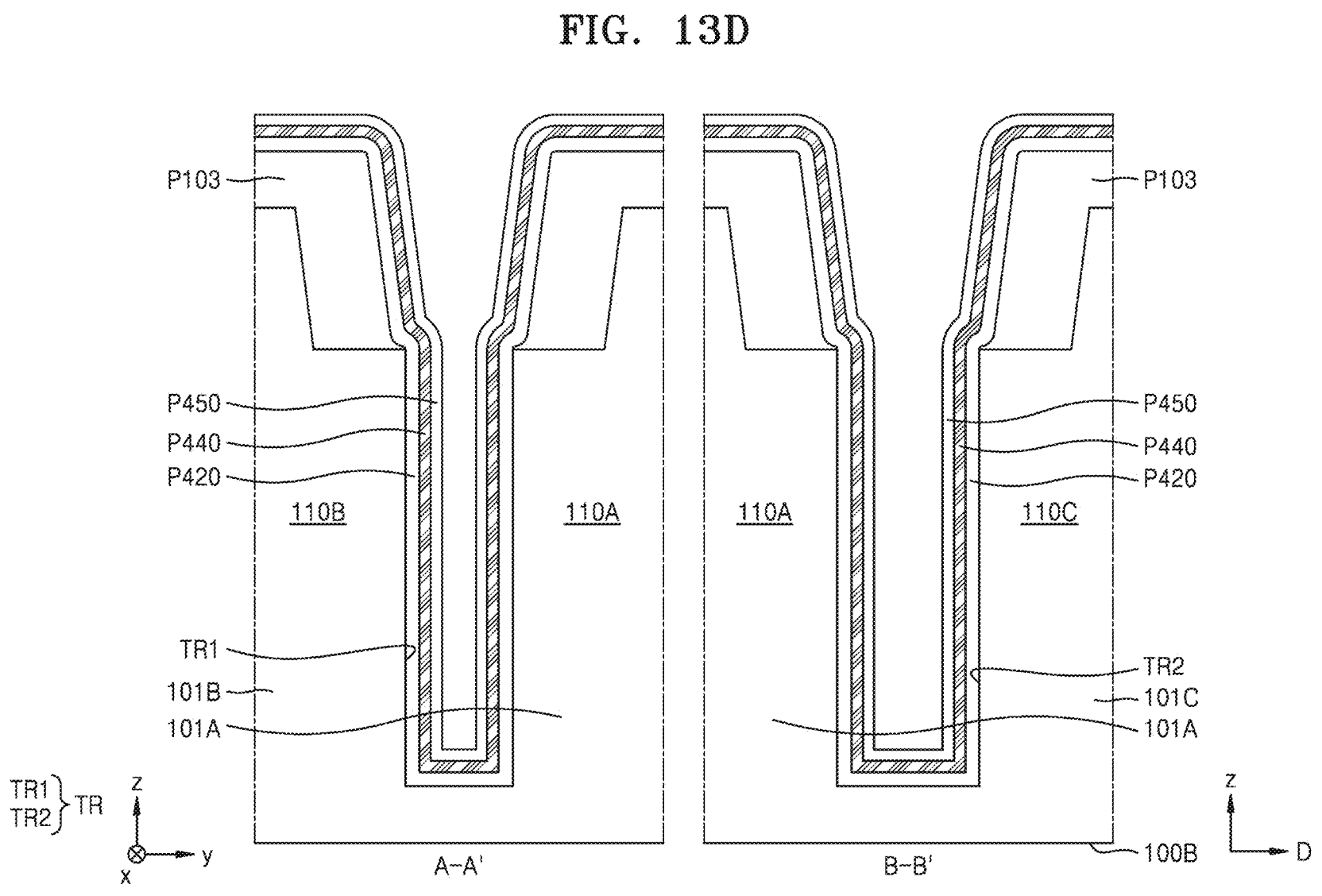

Referring to FIG. 13D, a first pre-insulating layer P450 may be formed on the first pre-semiconductor pattern P440. For example, the first pre-insulation layer P450 may be formed in the first trench region TR1 and the second trench region TR2 of the pixel isolation trench TR.

In some example embodiments, the first pre-insulation layer P450 may include an insulating material, such as silicon nitride, silicon oxide, or silicon oxynitride. In some example embodiments, the first pre-insulation layer P450 may have a thickness in a range from about or exactly 1 nm to about or exactly 100 nm.

In some example embodiments, the first pre-insulation layer P450 may be formed by using an ALD process performing at a temperature in a range from about or exactly 450° C. to about or exactly 700° C. or an LPCVD process performing at a temperature in a range from about or exactly 630° C. to about or exactly 810° C.

Figure 13E:
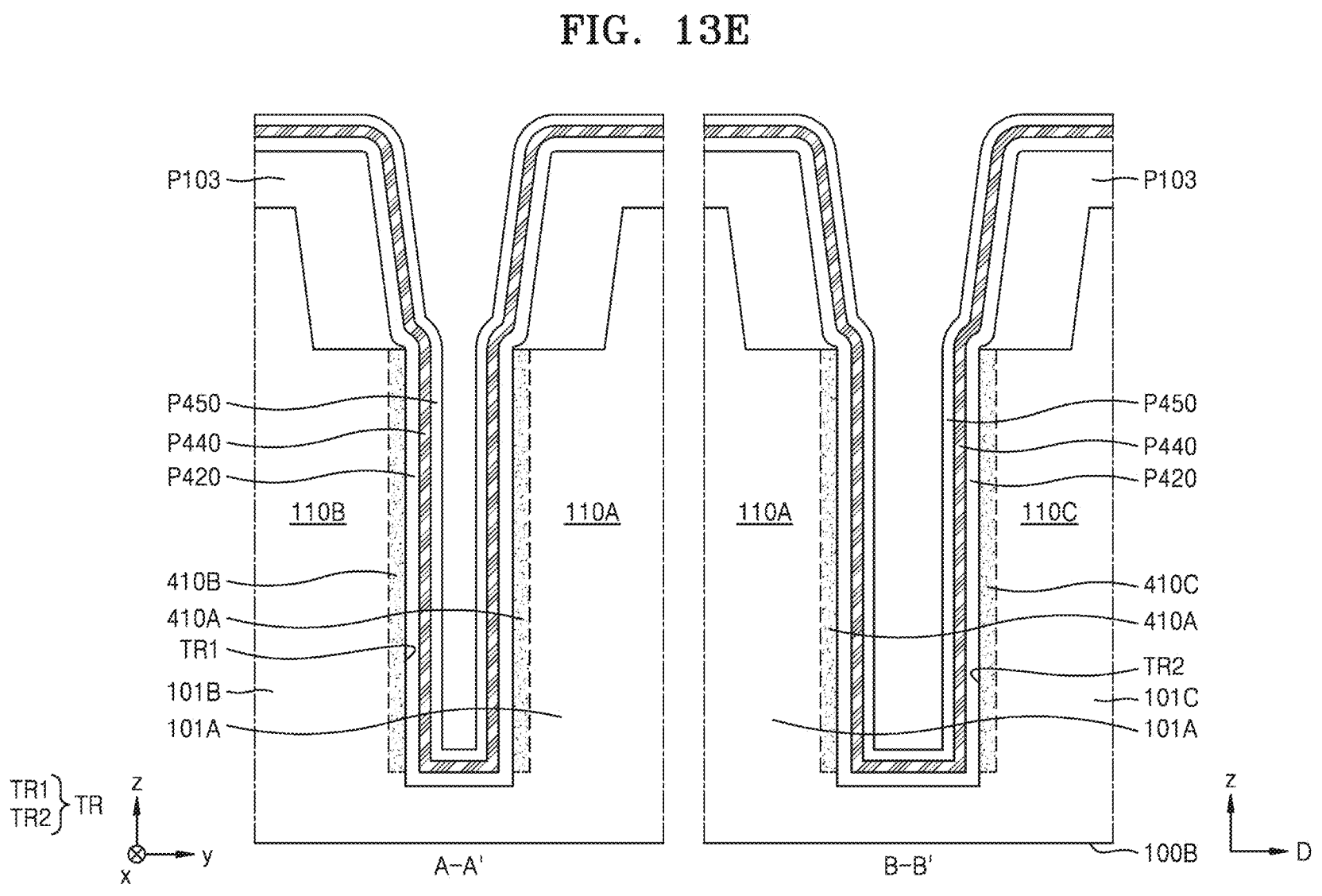

Referring to FIG. 13E, doped regions 410A, 410B, and 410C may be respectively formed in the photoelectric conversion regions 110A, 110B, and 110C by performing a heat treatment process. The heat treatment process may be performed under a temperature condition in a range from about or exactly 500° C. to about or exactly 1300° C. Through the heat treatment process, the first dopant is diffused into the first pre-semiconductor pattern P440, thereby forming the doped regions 410A, 410B, and 410C. Through the heat treatment process, the first dopant in the first pre-semiconductor pattern P440 may diffuse beyond the pre-dielectric layer P420. Due to the first pre-insulating layer P450 formed on the first pre-semiconductor pattern P440, the first dopant is not diffused in the opposite direction, that is, between the first pre-insulating layers P450 but is diffused towards the photoelectric conversion regions 110A, 110B, 110C, and thus, the doped regions 410A, 410B, and 410C may be formed.

In some example embodiments, the doped regions 410A, 410B, and 410C may be formed to a depth in a range from about or exactly 2 nm to about or exactly 200 nm.

Figure 13F:
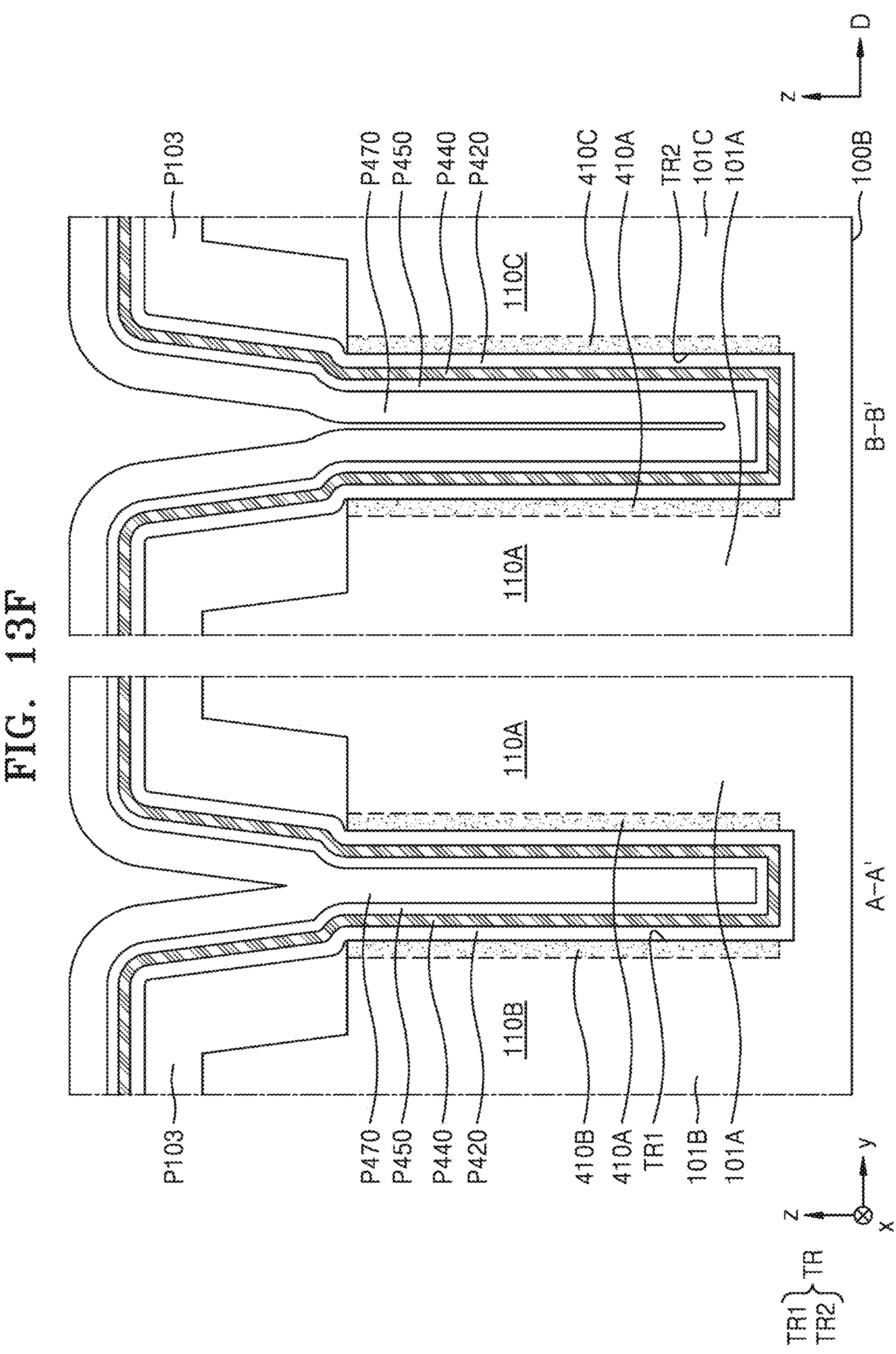

Referring to FIG. 13F, a first pre-buried insulating layer P470 may be formed on the first pre-insulating layer P450. For example, the first pre-buried insulating layer P470 may be formed on the first pre-insulation layer P450 of the first trench region TR1 and the second trench region TR2 of the pixel isolation trench TR.

In some example embodiments, the first pre-buried insulating layer P470 may completely fill a lower portion of the first trench region TR1 and may not completely fill an upper portion of the first trench region TR1. As described above, because the upper portion of the first trench region TR1 has a greater horizontal width than the lower portion thereof, while the first pre-buried insulating layer P470 completely fills the lower portion of the first trench region TR1, the upper portion of the first trench region TR1 may not be completely filled. That is, a portion of a side surface of the first pre-buried insulating layer P470 may be exposed at the upper portion of the first trench region TR1.

In some example embodiments, the first pre-buried insulating layer P470 may not completely fill the upper and lower portions of the second trench region TR2. Because a width of the second trench region TR2 in the horizontal direction (direction D) is greater than a width of the first trench region TR1 in the horizontal direction (direction Y), while the first pre-buried insulating layer P470 completely fills the lower portion of the first trench region TR1, the upper and lower portions of the second trench region TR2 may not be completely filled. That is, a portion of a side surface of the first pre-buried insulating layer P470 may be exposed at the upper and lower portions of the second trench region TR2.

Figure 13G:
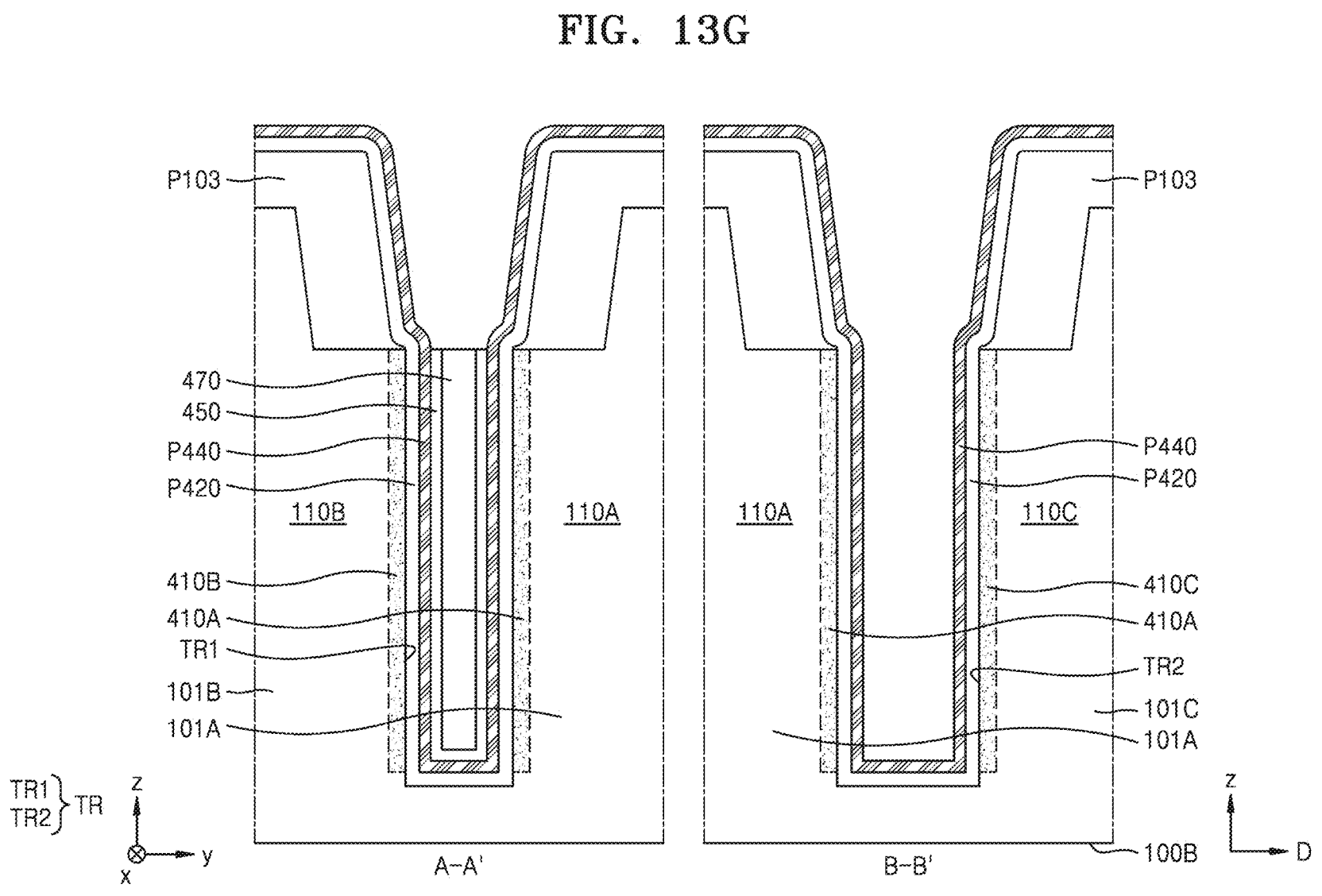

Referring to FIG. 13G, portions of the first pre-insulating layer P450 and the first pre-buried insulating layer P470 may be etched to form the first insulating layer 450 and the first buried insulating layer 470. For example, a portion of the first pre-buried insulating layer P470 having a partially exposed side surface may be removed from the upper portion of the first trench region TR1. For example, a portion of the first pre-buried insulating layer P450 exposed by removing a portion of the first pre-buried insulating layer P470 on the upper portion of the first trench region TR1 may be removed. Through this operation, the first insulating layer 450 and the first buried insulating layer 470 may be formed at the lower portion of the first trench region TR1. That is, the first pre-semiconductor pattern P440 may be exposed again in the upper portion of the first trench region TR1.

In some example embodiments, the first pre-buried insulating layer P470, a portion of a side surface of which is exposed, may be entirely removed from the upper and lower portions of the second trench region TR2, and the first pre-buried insulating layer P450 exposed by removing the first pre-buried insulating layer P470 may be entirely removed. That is, the first pre-semiconductor pattern P440 may be exposed again in the upper and lower portions of the second trench region TR2.

Figure 13H:
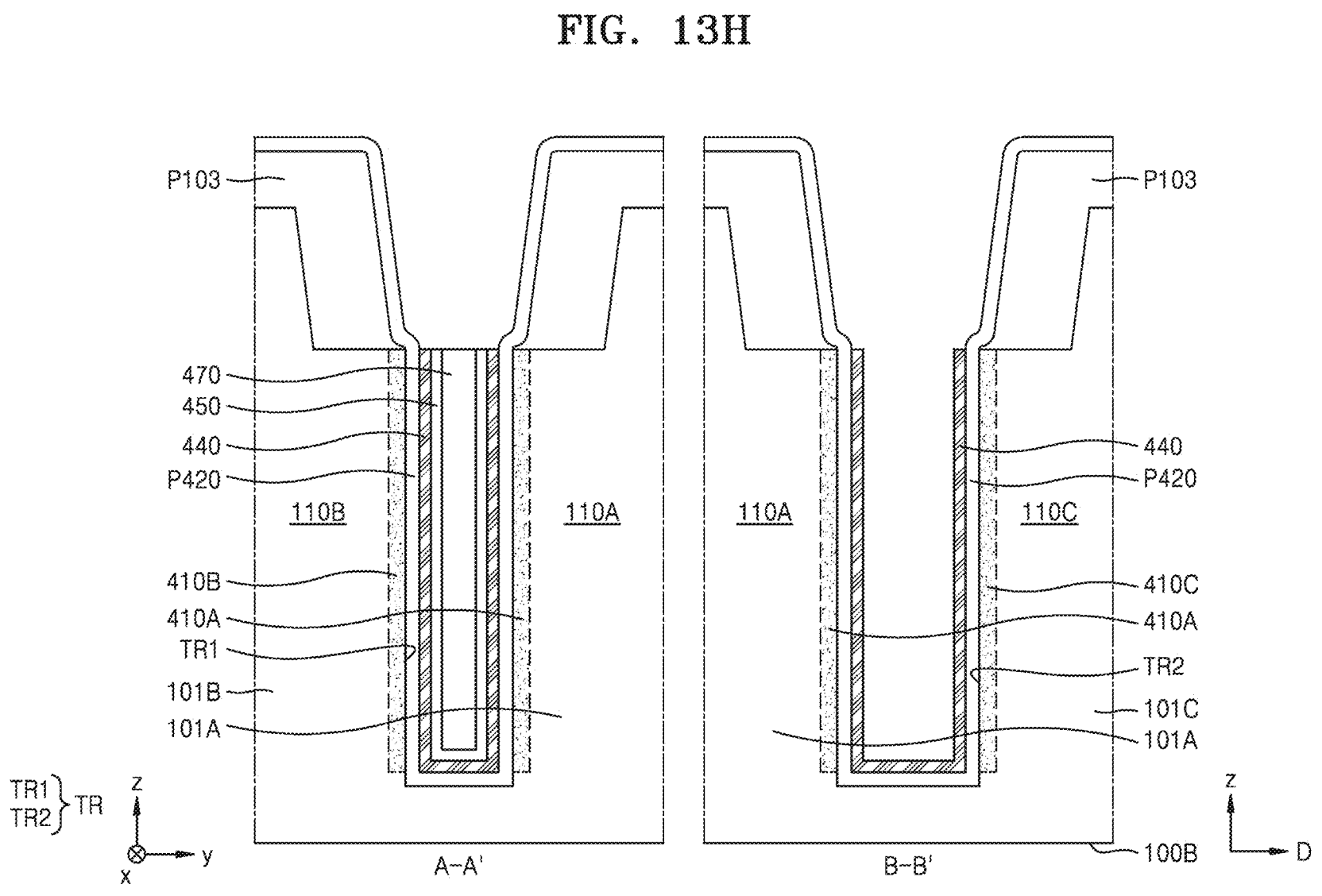

Referring to FIG. 13H, a portion of the first pre-semiconductor pattern P440 may be removed to form the first semiconductor pattern 440. For example, the first pre-semiconductor pattern P440 exposed in the upper portion of the first trench region TR1 may be removed. For example, the first pre-semiconductor pattern P440 exposed in the upper portion of the second trench region TR2 may be removed. Through this operation, the first semiconductor pattern 440 may be formed at the lower and upper portion of each of the first trench region TR1 and the second trench region TR2. That is, the pre-dielectric layer P420 may be exposed again at the upper portion of each of the first trench region TR1 and the second trench region TR2.

Figure 13I:
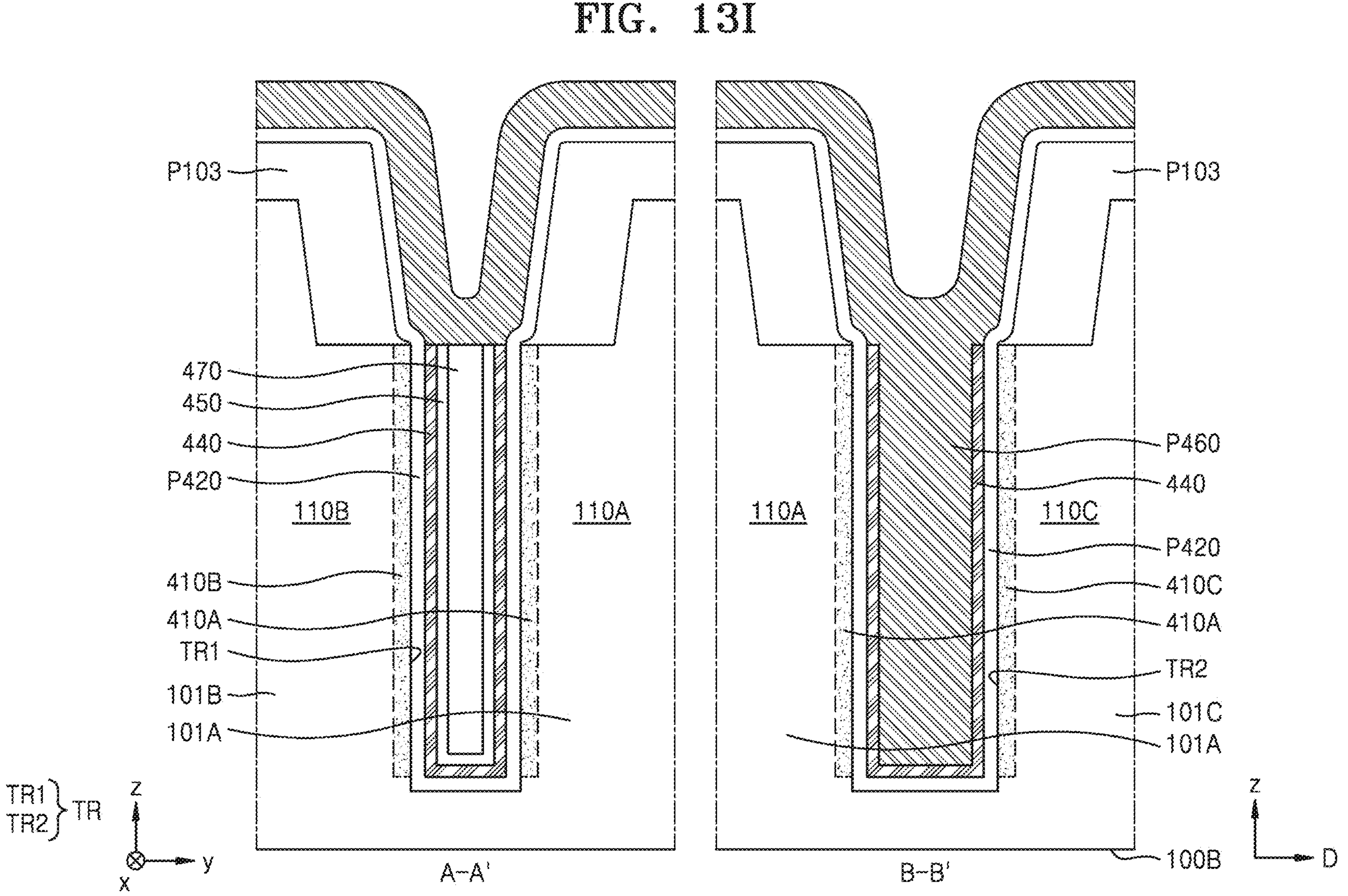

Referring to FIG. 13I, a second pre-semiconductor pattern P460 may be formed in the first trench region TR1 and the second trench region TR2. For example, the second pre-semiconductor pattern P460 may be formed on the pre-dielectric layer P420 in the upper portion of the first trench region TR1. The second pre-semiconductor pattern P460 may not completely fill the upper portion of the first trench region TR1. For example, the second pre-semiconductor pattern P460 may be formed on the first semiconductor pattern 440 in the lower portion of the second trench region TR2 to completely fill the lower portion of the second trench region TR2. For example, the second pre-semiconductor pattern P460 may be formed on the pre-dielectric layer P420 in the upper portion of the second trench region TR2. The second pre-semiconductor pattern P460 may not completely fill the upper portion of the second trench region TR2.

Figure 13J:
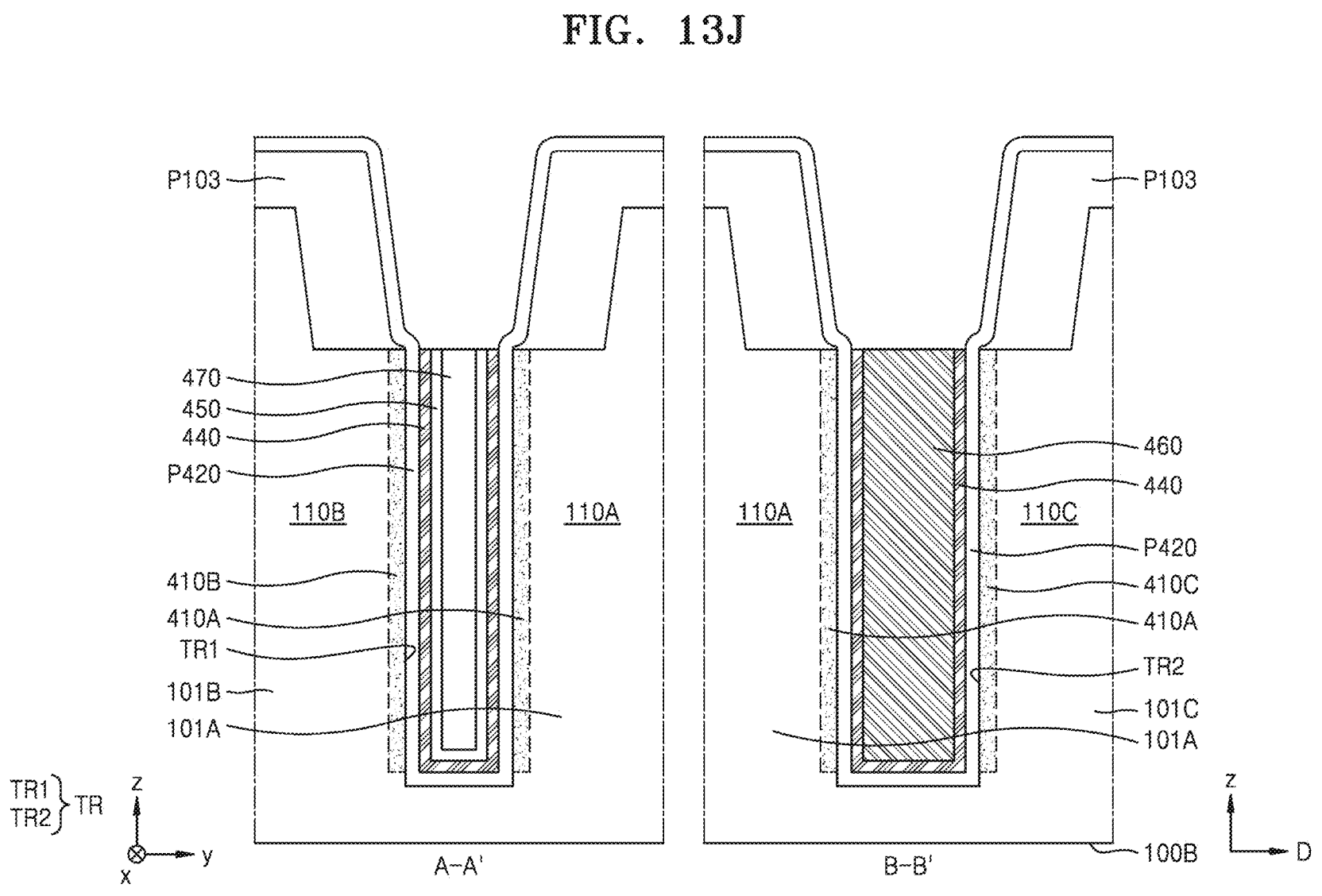

Referring to FIG. 13J, a portion of the second pre-semiconductor pattern P460 may be etched to form the second semiconductor pattern 460. For example, the second semiconductor pattern 460 may be formed by etching a portion of the second pre-semiconductor pattern P460 on the upper portion of the first trench region TR1 and the upper portion of the second trench region TR2. Through this operation, the second semiconductor pattern 460 filling the lower portion of the second trench region TR2 may be formed, and the pre-dielectric layer P420 may be exposed again on the upper portion of the first trench region TR1 and the upper portion of the second trench region TR2.

Figure 13K:
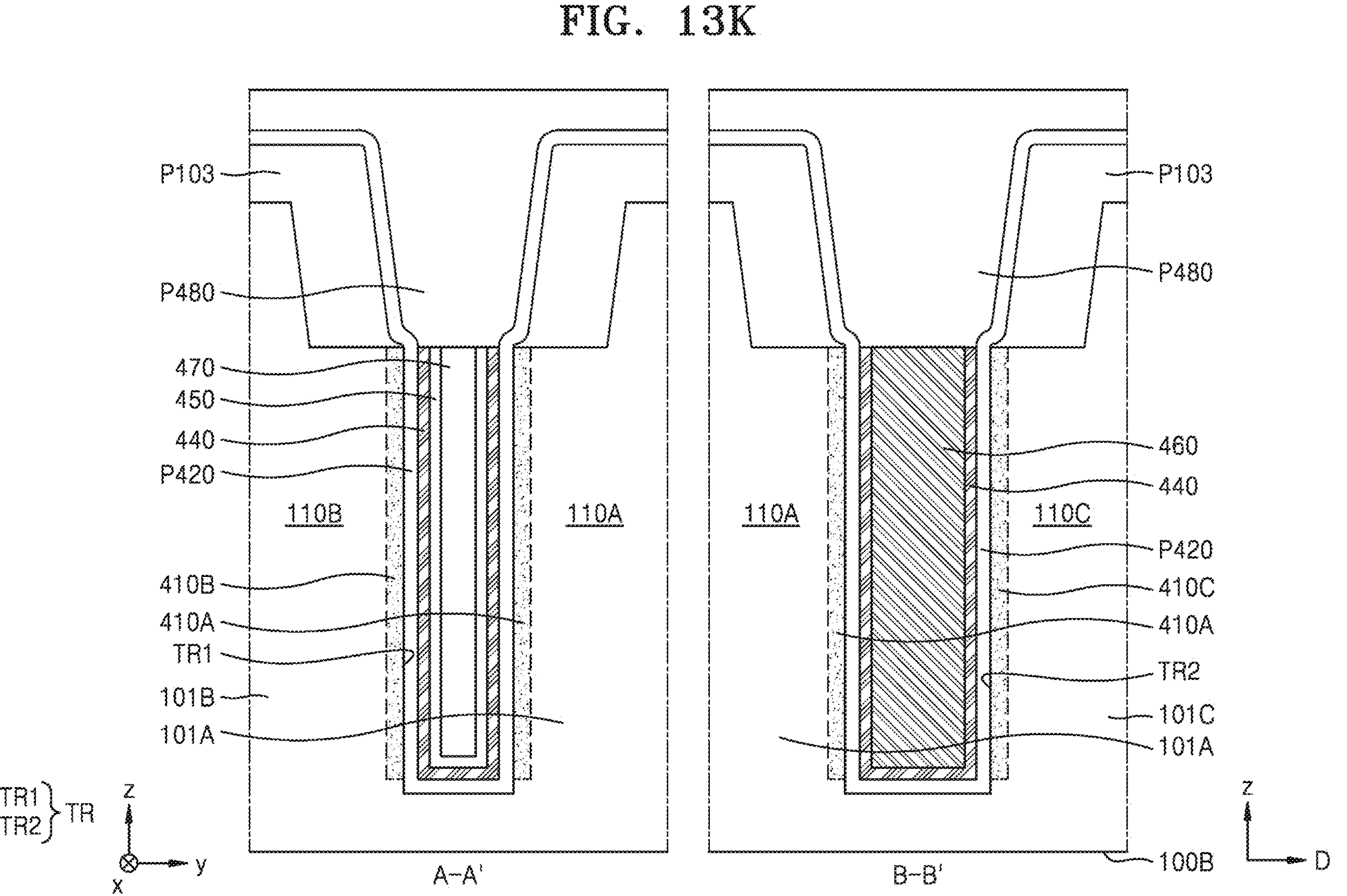

Referring to FIG. 13K, a second pre-buried insulating layer P480 completely filling the pixel isolation trench TR may be formed. For example, the second pre-buried insulating layer P480 may be formed to fill the upper portion of the first trench region TR1 and the upper portion of the second trench region TR2.

Figure 13L:
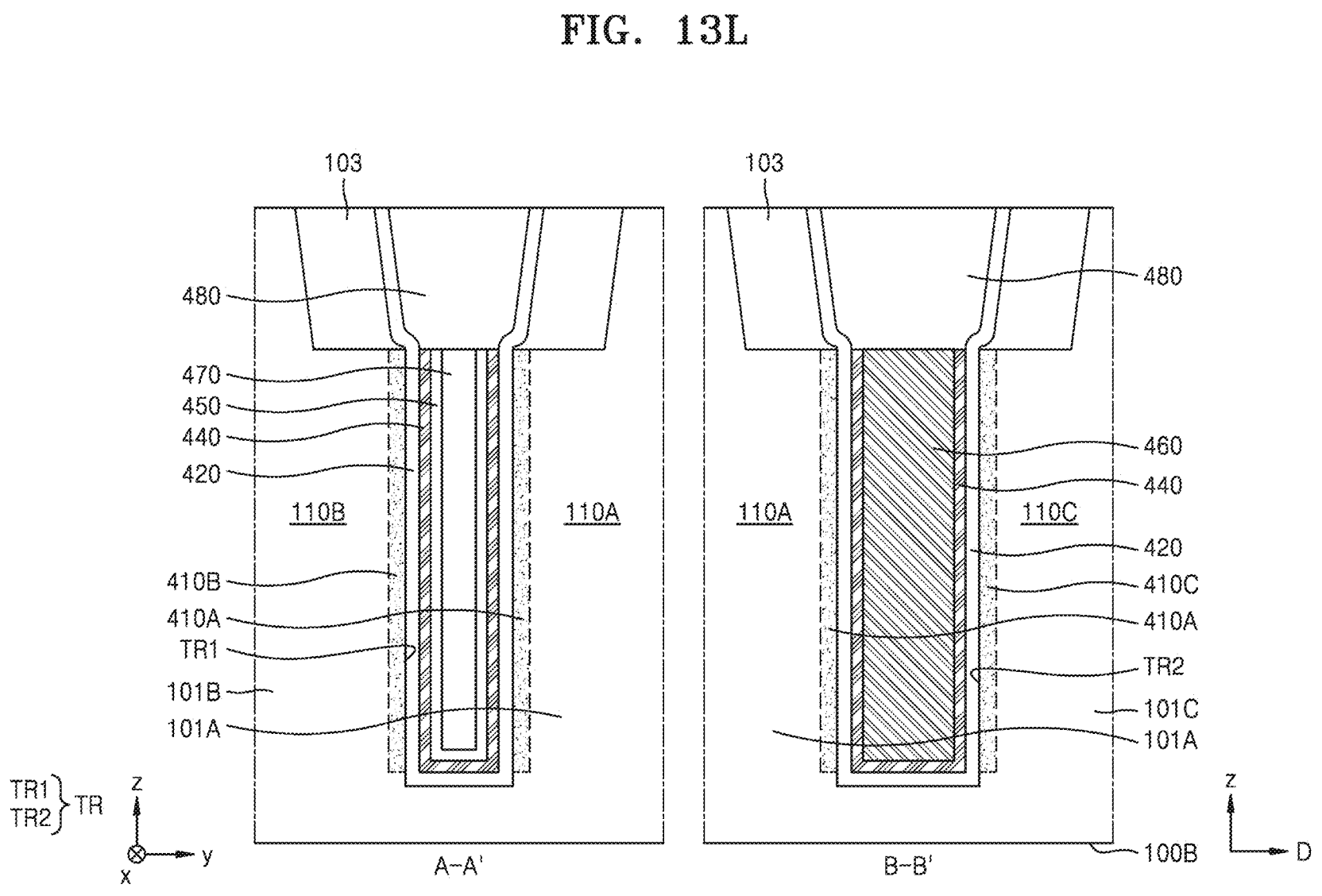

Referring to FIG. 13L, an isolation pattern 103, a dielectric layer 420, and a second buried insulating layer 480 may be formed by removing portions of a pre-isolation pattern P103, the pre-dielectric layer P420, and the second pre-buried insulating layer P480 on the upper portion of the pixel isolation trench TR.

Thereafter, a rear surface 100B of the substrate 100 may be etched to manufacture the image sensor 1 as shown in FIGS. 5A and 5B.

Although the manufacturing method of the image sensor 1 shown in FIGS. 5A and 5B has been described with reference to FIGS. 13A to 13L in the specification, those skilled in the art may easily understand the method of manufacturing the image sensors 1A, 1B, 1C, 2, 2A, 2B, and 2C shown in FIGS. 6A to 8B and FIGS. 9 to 12 from the technical concepts described with reference to FIGS. 13A to 13L.

When the terms “about” or “substantially” are used in this specification in connection with a numerical value, it is intended that the associated numerical value includes a manufacturing or operational tolerance (e.g., ±10%) around the stated numerical value. Moreover, when the words “generally” and “substantially” are used in connection with geometric shapes, it is intended that precision of the geometric shape is not required but that latitude for the shape is within the scope of the disclosure. Further, regardless of whether numerical values or shapes are modified as “about” or “substantially,” it will be understood that these values and shapes should be construed as including a manufacturing or operational tolerance (e.g., ±10%) around the stated numerical values or shapes.

While the inventive concepts have been particularly shown and described with reference to example embodiments thereof, it will be understood that various changes in form and details may be made therein without departing from the spirit and scope of the following claims.

What is claimed is:

1. An image sensor comprising:
a substrate;
a unit pixel region in the substrate and including a photoelectric conversion region;
a pixel isolation trench defining the unit pixel region, penetrating the substrate in a vertical direction, and extending in a first horizontal direction and a second horizontal direction crossing each other; and
a pixel isolation structure in the pixel isolation trench, wherein
the pixel isolation structure includes
a dielectric layer on an inner wall of the pixel isolation trench;
a first semiconductor pattern conformally on the dielectric layer and including a first dopant;
a first insulating layer on a first portion of the first semiconductor pattern overlapping the photoelectric conversion region in one of the first horizontal direction and the second horizontal direction;
a second semiconductor pattern on a second portion of the first semiconductor pattern that does not overlap the photoelectric conversion region in the first horizontal direction and the second horizontal direction,
the photoelectric conversion region includes a doped region on an outer wall of the pixel isolation structure, and
the doped region includes the first dopant.

2. The image sensor of claim 1, wherein the first dopant includes a P-type dopant.

3. The image sensor of claim 2, wherein the P-type dopant includes at least one of boron (B), aluminum (Al), or indium (In).

4. The image sensor of claim 1, wherein the first insulating layer includes silicon nitride.

5. The image sensor of claim 1, wherein the first insulating layer includes
an insulating liner including silicon nitride; and
a first buried insulating layer including silicon oxide.

6. The image sensor of claim 1, wherein the first insulating layer is not between the second semiconductor pattern and the first semiconductor pattern.

7. The image sensor of claim 1, further comprising a second buried insulating layer on the second semiconductor pattern.

8. The image sensor of claim 1, wherein the dielectric layer has a thickness in a range from 1 nm to 200 nm.

9. The image sensor of claim 1, wherein the first semiconductor pattern has a thickness in a range from 1 nm to 50 nm.

10. An image sensor comprising:
a substrate;
a plurality of unit pixel regions in the substrate and spaced apart from each other in a first horizontal direction and a second horizontal direction;
a plurality of photoelectric conversion regions within the plurality of unit pixel regions and including a doped region, respectively;

a lattice-shaped pixel isolation trench defining the plurality of unit pixel regions and penetrating the substrate in a vertical direction; and a pixel isolation structure within the pixel isolation trench, wherein the pixel isolation trench includes a first region and a second region in the first horizontal direction and the second horizontal direction, and the first region is a region excluding the second region, and the second region includes a central region that does not overlap with the photoelectric conversion region in the first horizontal direction and the second horizontal direction, the pixel isolation structure includes a dielectric layer on an inner wall of the pixel isolation trench;

a first semiconductor pattern conformally on the dielectric layer and including a first dopant;

a first buried insulating layer in the first region on the first semiconductor pattern; and a second semiconductor pattern in the second region on the first semiconductor pattern, and the doped region includes the first dopant.

11. The image sensor of claim 10, wherein the first dopant includes a P-type dopant.

12. The image sensor of claim 11, wherein the P-type dopant includes at least one of boron, aluminum, or indium.

13. The image sensor of claim 10, wherein the pixel isolation structure further includes an insulating liner between the first semiconductor pattern and the first buried insulating layer in the first region.

14. The image sensor of claim 10, wherein the pixel isolation structure further includes a second buried insulating layer on the second semiconductor pattern in the second region.

15. The image sensor of claim 10, wherein the second region further includes an extension region extending in at least one of the first horizontal direction and the second horizontal direction.

16. The image sensor of claim 15, wherein the second region has a cross-shape in a plan view.

17. The image sensor of claim 10, wherein the first semiconductor pattern includes polysilicon including the first dopant.

18. The image sensor of claim 10, wherein the dielectric layer includes at least one of $SiO_2$, $Si_3N_4$, SiCN, SiOCN, and SiON.

19. The image sensor of claim 10, wherein the second semiconductor pattern includes polysilicon including no dopant.

20. An image sensor comprising:

a substrate having a first surface and a second surface opposite to each other;

a plurality of photoelectric conversion regions spaced apart from each other in a first horizontal direction and a second horizontal direction, including a first photoelectric conversion region in the substrate in a direction perpendicular to a first surface; a second photoelectric conversion region overlapping with the first photoelectric conversion region in one of the first horizontal direction and the second horizontal direction; and a third photoelectric conversion region not overlapping with the first photoelectric conversion region in the first horizontal direction and the second horizontal direction;

a pixel isolation structure between each of the plurality of photoelectric conversion regions and in a pixel isolation trench penetrating through the substrate from the first surface; and a color filter and a micro lens on the second surface, wherein the pixel isolation trench includes: a straight-line shaped first trench region between the first photoelectric conversion region and the second photoelectric conversion region and a cross-shaped second trench region between the first photoelectric conversion region and the third photoelectric conversion region, the pixel isolation structure includes a dielectric layer on inner walls of the first trench region and the second trench region of the pixel isolation trench; a first semiconductor pattern that conformally covers the dielectric layer and includes polysilicon doped with boron (B); a first insulating layer on the first semiconductor pattern in the first trench region and including silicon nitride; and a second semiconductor pattern disposed on the first semiconductor pattern in the second trench region and including undoped polysilicon, the plurality of photoelectric conversion regions each include a doped region on an outer wall of each of the first trench region and the second trench region, and the doped region is doped with boron (B).

* * * * *